(12) United States Patent
Kim et al.

(10) Patent No.: US 10,477,675 B1
(45) Date of Patent: Nov. 12, 2019

(54) ELECTRONIC DEVICE INCLUDING CAPACITIVE STRUCTURE

(71) Applicant: SAMSUNG ELECTRONICS CO., LTD., Suwon-si, Gyeonggi-do (KR)

(72) Inventors: Minsoo Kim, Suwon-si (KR); Hyuntae Jung, Suwon-si (KR); Jiwoo Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/377,582

(22) Filed: Apr. 8, 2019

(30) Foreign Application Priority Data

Jun. 11, 2018 (KR) .......................... 10-2018-0066787

(51) Int. Cl.
  *H05K 1/02* (2006.01)
  *H01Q 1/48* (2006.01)
  (Continued)

(52) U.S. Cl.
  CPC ............. *H05K 1/0231* (2013.01); *H01Q 1/48* (2013.01); *H01Q 1/526* (2013.01); *H04M 1/0277* (2013.01); *H05K 1/0219* (2013.01)

(58) Field of Classification Search
  CPC ...... H05K 1/0231; H05K 1/0219; H01Q 1/48; H01Q 1/526; H04M 1/0277
  See application file for complete search history.

(56) References Cited

U.S. PATENT DOCUMENTS 7,369,088 B2  5/2008 Kushihi
8,704,730 B2  4/2014 Lopez et al.
(Continued)

FOREIGN PATENT DOCUMENTS

KR   10-2017-0105896   9/2017

OTHER PUBLICATIONS

International Search Report dated Jul. 24, 2019 in counterpart International Patent Application No. PCT/KR2019/004463.

*Primary Examiner* — Hoa C Nguyen
*Assistant Examiner* — Amol H Patel
(74) *Attorney, Agent, or Firm* — Nixon & Vanderhye, P.C.

(57) ABSTRACT

Various embodiments of the disclosure relate to an electronic device including a capacitive structure. The electronic device may include: a housing including a first plate, a second plate facing a direction opposite the first plate, and a side member comprising a side wall surrounding a space between the first plate and the second plate, the side member including a conductive portion; a conductive mid-plate disposed in the housing parallel to the second plate; a dielectric gap formed between the conductive portion and the conductive mid-plate; a printed circuit board (PCB) disposed inside the housing between the conductive mid-plate and the second plate, the PCB including a ground plane; and a capacitive structure comprising a conductive material disposed at a boundary portion of the dielectric gap and the conductive mid-plate between the conductive mid-plate and the PCB, the capacitive structure including a first conductive layer connected to the conductive mid-plate, a second conductive layer spaced apart from the first conductive layer and electrically connected to the ground plane, and a dielectric layer interposed between the first conductive layer and the second conductive layer.

20 Claims, 15 Drawing Sheets

(51) Int. Cl.
*H04M 1/02* (2006.01)
*H01Q 1/52* (2006.01)

(56) References Cited

U.S. PATENT DOCUMENTS

| | | | |
|---|---|---|---|
| 2009/0257207 A1* | 10/2009 | Wang | G06F 1/1626 |
| | | | 361/752 |
| 2014/0323063 A1 | 10/2014 | Xu et al. | |
| 2017/0068279 A1* | 3/2017 | Jarvis | G06F 1/1658 |
| 2017/0207516 A1* | 7/2017 | Koo | H01Q 1/44 |
| 2017/0263998 A1* | 9/2017 | Park | H01Q 1/12 |
| 2017/0336970 A1* | 11/2017 | Kim | G06F 3/0414 |
| 2018/0090821 A1 | 3/2018 | Lee et al. | |
| 2019/0155449 A1* | 5/2019 | Goo | G06F 3/0418 |

\* cited by examiner

ELECTRONIC DEVICE INCLUDING CAPACITIVE STRUCTURE

CROSS-REFERENCE TO RELATED APPLICATION

This application is based on and claims priority under 35 U.S.C. § 119 to Korean Patent Application No. 10-2018-0066787, filed on Jun. 11, 2018, in the Korean Intellectual Property Office, the disclosure of which is incorporated by reference herein in its entirety.

BACKGROUND

1) Field

The disclosure relates to an electronic device including a capacitive structure.

2) Description of Related Art

An electronic device may utilize a metal housing exposed to the outside as an antenna. For example, the electronic device may output an RF signal through the antenna, and may generate an electric field by the antenna.

While the electronic device outputs the RF signal through the antenna, an image current corresponding to the electric field generated by the antenna may be induced in a mid-plate disposed in the metal housing to face the antenna. The image current may form an induced electric field when encountering a specific structure inside the metal housing while rotating along the mid-plate, and the induced electric field may have a resonant frequency band similar to the electric field generated by the antenna.

In a conventional electronic device, since an induction electric field having a resonant frequency band similar to the electric field generated by the antenna causes antenna interference, a ground design for eliminating the image current may be required.

In the conventional electronic device, the mid-plate and a printed circuit board are electrically connected to each other using a conductive member (e.g., a C-clip) in order to remove the image current, and the conductive member is connected to a ground of a printed circuit board (PCB) via a wiring line and a capacitor formed on the PCB.

However, in the above-described conventional electronic device, the number of portions connecting the mid-plate and the PCB through a conductive member is large, and due to this, the length of a wiring line connecting the conductive member and the capacitor is increased. An increase in the length of the wiring line may cause parasitic resonance, which decreases the performance of the antenna by increasing impedance due to the inductance of the wiring line and the capacitance of the capacitor.

The above information is presented as background information only to assist with an understanding of the disclosure. No determination has been made, and no assertion is made, as to whether any of the above might be applicable as prior art with regard to the disclosure.

SUMMARY

According to various example embodiments of the disclosure, an electronic device capable of preventing and/or reducing performance degradation by disposing a capacitive structure configured to block a conductive path on a mid-plate so that the image current can be removed and/or reduced and the length of a wiring line for ground connection of a PCB can be reduced is provided.

An electronic device according to various example embodiments of the disclosure may include: a housing including a first plate, a second plate facing a direction opposite the first plate, and a side member comprising a side wall surrounding a space between the first plate and the second plate, wherein the side member includes a conductive portion; a conductive mid-plate disposed inside the housing parallel to the second plate, wherein the conductive mid-plate defines an opening together with the conductive portion when viewed from above the second plate; a display disposed between the conductive mid-plate and the first plate and viewable through at least part of the first plate; a dielectric material filling at least part of the opening; a printed circuit board (PCB) disposed inside the housing between the conductive mid-plate and the second plate, the PCB including a ground plane; a capacitive structure comprising a conductive material disposed between the conductive mid-plate and the PCB wherein the dielectric material is disposed between the capacitive structure and the conductive portion when viewed from above the second plate, the capacitive structure including a first conductive layer attached to the conductive mid-plate, a second conductive layer spaced apart from the first conductive layer, and a dielectric layer interposed between the first conductive layer and the second conductive layer; and a conductive member comprising a conductive material interposed between and in contact with the second conductive layer and the PCB, wherein the conductive member is electrically connected to the ground plane.

An electronic device according to various example embodiments of the disclosure may include: a housing including a first plate facing a first direction, a second plate facing a direction opposite the first direction, and a side member comprising a side wall surrounding a space between the first plate and the second plate, wherein the side member includes a conductive portion; a conductive mid-plate disposed in the housing parallel to the second plate; a dielectric gap formed between the conductive portion and the conductive mid-plate; a printed circuit board (PCB) disposed inside the housing between the conductive mid-plate and the second plate, the PCB including a ground plane; and a capacitive structure comprising a conductive material disposed at a boundary portion of the dielectric gap and the conductive mid-plate between the conductive mid-plate and the PCB, the capacitive structure including a first conductive layer attached to the conductive mid-plate, a second conductive layer spaced apart from the first conductive layer and electrically connected to the ground plane, and a dielectric layer interposed between the first conductive layer and the second conductive layer.

According to various example embodiments of the disclosure, it is possible to remove and/or reduce an image current that deteriorates antenna performance and to reduce the length of a wiring line for ground connection of a PCB by disposing a capacitive structure configured to block a conductive path on a mid-plate.

BRIEF DESCRIPTION OF THE DRAWINGS

The above and other aspects, features and advantages of certain embodiments of the present disclosure will be apparent from the following detailed description, taken in conjunction with the accompanying drawings, in which.

DETAILED DESCRIPTION

Figure 1:
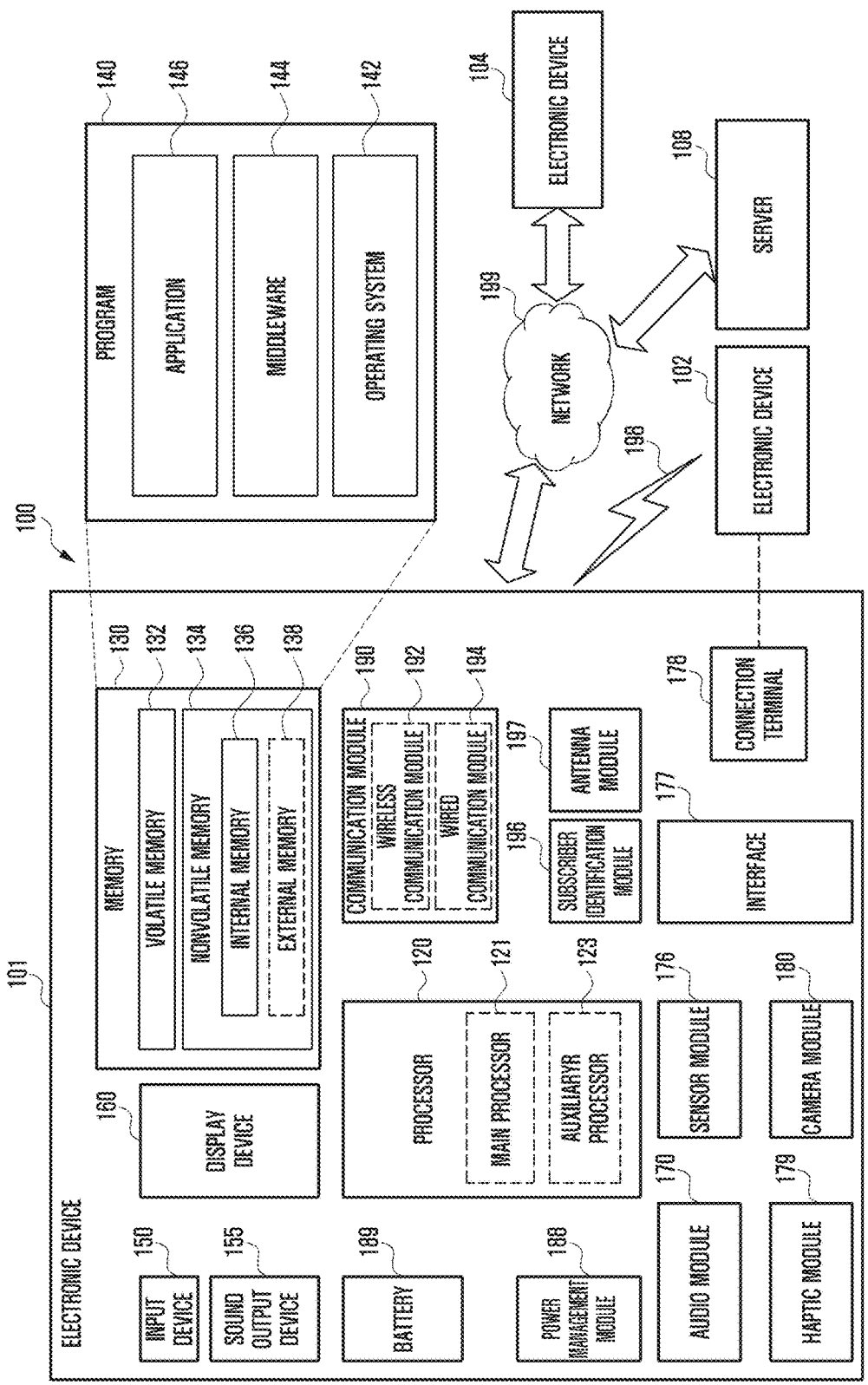
FIG. 1 is a block diagram illustrating an example electronic device in a network environment, according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
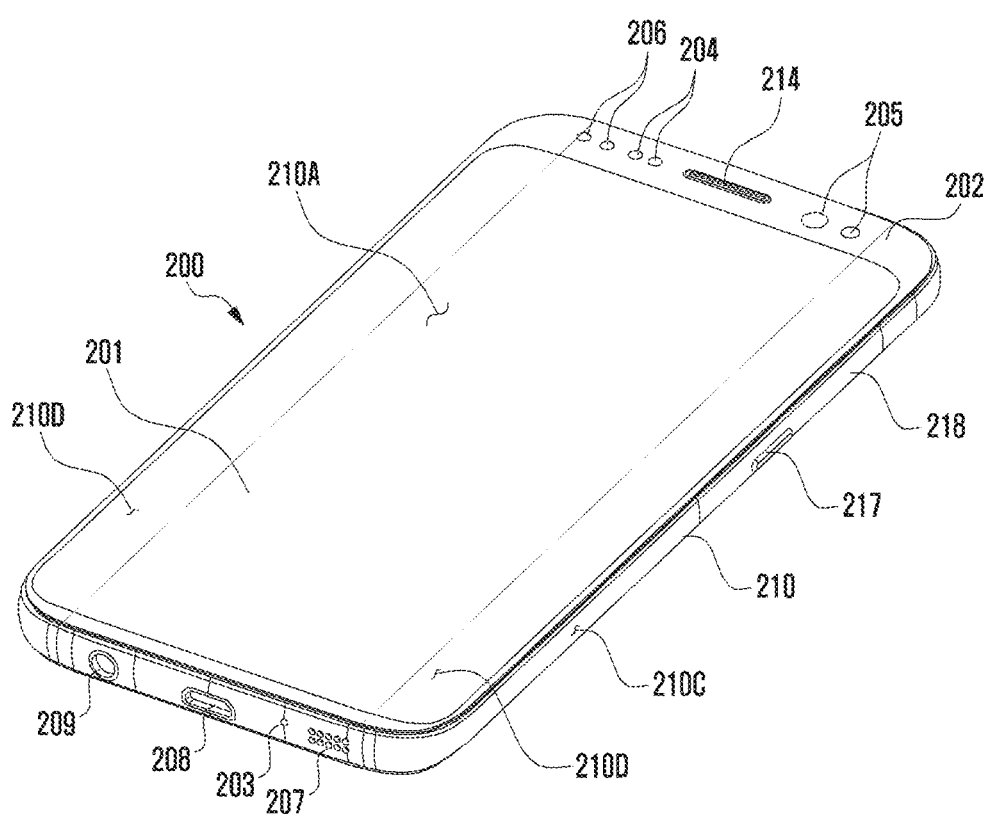
FIG. 2 is a front side perspective view of an example mobile electronic device according to an embodiment.
Figure 3:
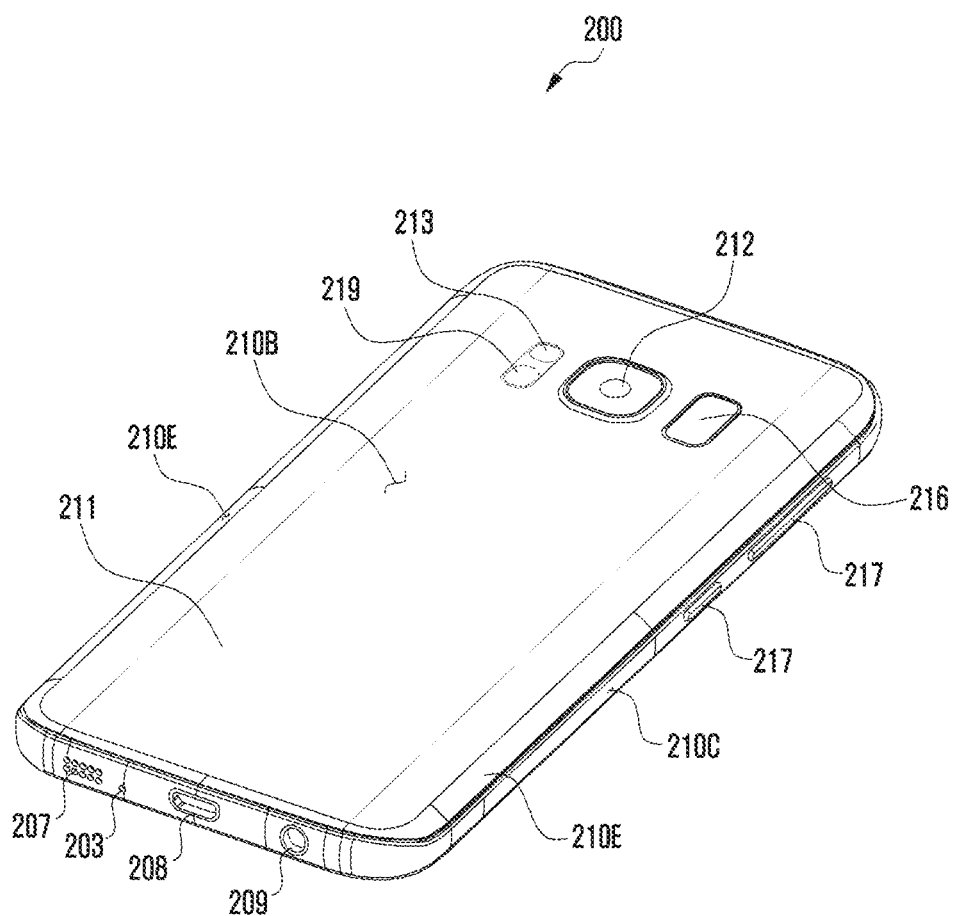
FIG. 3 is a rear side perspective view of the electronic device of FIG. 2.

Referring to FIGS. 2 and 3, an electronic device 200 (e.g., the electronic device 101 in FIG. 1) according to an embodiment may include: a housing 210 including a first face (or a front face) 210A, a second face (or a rear face) 210B, and a side face 210C surrounding a space between the first face 210A and the second face 210B. In another embodiment (not illustrated), the term "housing" may refer to a structure forming part of the first face 210A, the second face 210B, and the side face 210C of FIG. 2. According to an embodiment, at least part of the first face 210A may be formed of a substantially transparent front plate 202 (e.g., a glass plate or a polymer plate including various coating layers). The second face 210B may be formed by a substantially opaque rear plate 211. The rear plate 211 may be formed of, for example, coated or colored glass, ceramic, polymer, metal (e.g., aluminum, stainless steel (STS), or magnesium), or a combination thereof. The side face 210C may be formed by a side bezel structure (or a "side member") 218 coupled to the front plate 202 and the rear plate 211 and including a metal and/or a polymer. In some embodiments, the rear plate 211 and the side bezel structure 218 may be integrally formed, and may include the same material (e.g., a metal material such as aluminum).

In the illustrated embodiment, the front plate 202 may include two first regions 210D, which are bent from the first face 210A toward the rear plate 211 and extend seamlessly, at the long opposite side edges thereof. In the illustrated embodiment (see FIG. 2), the rear plate 211 may include two second regions 210E, which are bent from the second face 210B toward the front plate 202 and extend seamlessly, at the long opposite side edges thereof. In some embodiments, the front plate 202 (or the rear plate 211) may include only one of the first regions 210D (or the second regions 210E). In another embodiment, some of the first regions 210D and the second regions 210E may not be included. In the above embodiments, when viewed from a side of the electronic device 200, the side bezel structure 218 may have a first thickness (or width) on a side face where the first regions 210D or the second regions 210E are not included, and may have a second thickness (or width), which is thinner than the first thickness, on a side where the first regions 210D or the second regions 210E are included.

According to an embodiment, the electronic device 200 may include one or more of a display 201, audio modules 203, 207, and 214, sensor modules 204, 216, and 219, camera modules 205, 212, and 213, key input devices 217, light-emitting elements 206, and connector holes 208 and 209. In some embodiments, in the electronic device 200, at least one of the components (e.g., the key input devices 217 or the light-emitting elements 206) may be omitted, or other components may be additionally included.

The display 201 may be exposed, for example, through a substantial portion of the front plate 202. In some embodiments, at least part of the display 201 may be exposed through the front plate 202 forming the first face 210A and the first regions 210D of the side faces 210C. In some embodiments, the edges of the display 201 may be formed to be substantially the same as the adjacent contours of the front plate 202. In another embodiment (not illustrated), the distance between the outer contour of the display 201 and the outer contour of the front plate 202 may be substantially constant in order to enlarge the exposed area of the display 201.

In another embodiment (not illustrated), a recess or an opening is disposed in a portion of a screen display region of the display 201, and at least one of an audio module 214, a module 204, a camera module 205, and a light-emitting element 206 may be aligned with the recess or the opening. In another embodiment (not illustrated), a rear face of the screen display region of the display 201 may include at least one of an audio module 214, a sensor module 204, a camera module 205, a fingerprint sensor 216, and a light-emitting element 206. In another embodiment (not illustrated), the display 201 may be coupled to or disposed adjacent to a touch-sensing circuit, a pressure sensor capable of measuring the intensity of the touch (pressure), and/or a digitizer that detects a stylus pen. In some embodiments, at least some of the sensor modules 204 and 219 and/or at least some of the key input devices 217 may be disposed in the first regions 210D and/or the second regions 210E.

The audio modules 203, 207, and 214 may include a microphone hole 203 and speaker holes 207 and 214. The microphone hole 203 may have a microphone disposed therein so as to acquire external sound, and in some embodiments, a plurality of microphones disposed therein so as to sense the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker (e.g., a piezo speaker) may be included without the speaker holes 207 and 214.

The sensor modules 204, 216, and 219 may generate electrical signals or data values corresponding to an operating state inside the electronic device 200 or an external environmental condition. The sensor modules 204, 216, and 219 may include, for example, a first sensor module 204 (e.g., a proximity sensor) and/or a second sensor module (not illustrated) (e.g., a fingerprint sensor) disposed on the first face 210A of the housing 210, and/or a third sensor module 219 (e.g., an HRM sensor) and/or a fourth sensor module 216 (e.g., a fingerprint sensor) disposed on the second face 210B of the housing 210. The fingerprint sensor may be disposed not only on the first face 210A of the housing 210 (e.g., the display 201), but also on the second face 210B. The electronic device 200 may further include at least one of sensors (not illustrated) such as a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, and an illuminance sensor 204.

The camera modules 205, 212, and 213 may include a first camera device 205 disposed on the first face 210A of the electronic device 200, a second camera device 212 disposed on the second surface 210B of the electronic device 200, and/or a flash 213. The camera modules 205 and 212 may include one or more lenses, an image sensor, and/or an image signal processor. The flash 213 may include, for example, a light-emitting diode or a xenon lamp. In some embodiments, two or more lenses (e.g., an infrared camera lens, a wide-angle lens, and a telephoto lens) and image sensors may be disposed on one face of the electronic device 200.

The key input devices 217 may be disposed on the side surfaces 210C of the housing 210. In another embodiment, the electronic device 200 may not include some or all of the above-mentioned key input devices 217, and a non-included key input device 217 may be implemented in another form such as a soft key on the display 201. In some embodiments, the key input devices may include a sensor module 216 disposed on the second face 210B of the housing 210.

The light-emitting element 206 may be disposed, for example, on the first face 210A of the housing 210. The light-emitting element 206 may provide, for example, status information of the electronic device 200 in an optical form. In another embodiment, the light-emitting element 206 may provide a light source that is interlocked with, for example, the operation of the camera module 205. The light-emitting element 206 may include, for example, an LED, an IR LED, and a xenon lamp.

The connector holes 208 and 209 may include a first connector hole 208 capable of accommodating a connector (e.g., a USB connector) for transmitting and receiving power and/or data to and from an external electronic device, and/or a second connector hole 209 capable of receiving a connector (e.g., an earphone jack) for transmitting and receiving an audio signal to and from an electronic device.

Figure 4:
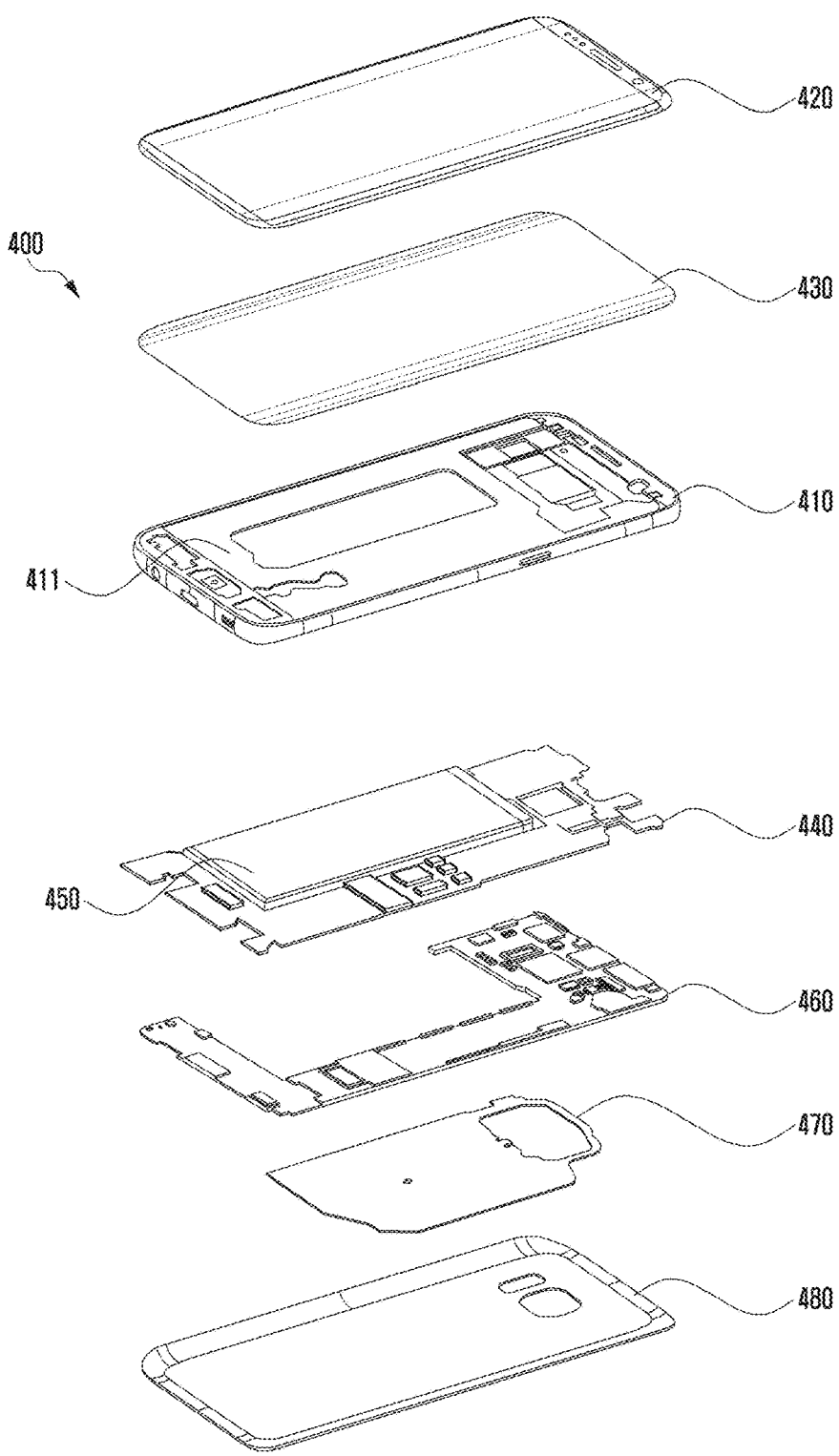
FIG. 4 is an exploded perspective view of the electronic device of FIG. 2.

Referring to FIG. 4, an electronic device 400 (e.g., the electronic device 101 in FIG. 1) may include a side bezel structure 410, a first support member 411 (e.g., a bracket or support), a front plate 420, a display 430, a printed circuit board 440, a battery 450, a second support member 460 (e.g., a rear case or support), an antenna 470, and a rear plate 480. In some embodiments, in the electronic device 400, at least one of the components (e.g., the first support member 411 or the second support member 460) may be omitted, or other components may be additionally included. At least one of the components of the electronic device 400 may be the same as or similar to at least one of the components of the electronic device 200 of FIG. 2 or 3, and a redundant description thereof will not be repeated below.

The first support member 411 may be disposed inside the electronic device 400 and connected to the side bezel structure 410, or may be formed integrally with the side bezel structure 410. The first support member 411 may be formed of, for example, a metal material and/or a non-metal (e.g., polymer) material. A display 430 may be coupled to one side of the first support member 411, and a printed circuit board 440 may be coupled to the other side of the first support member 311. On the printed circuit board 440, a processor, a memory, and/or an interface may be mounted. The processor may include various processing circuitry, such as, for example, and without limitation, one or more of, a central processing unit, an application processor, a graphic processor, an image signal processor, a sensor hub processor, a communication processor, or the like.

The memory may include, for example, a volatile memory or a non-volatile memory.

The interface may include, for example, and without limitation, an HDMI, a USB interface, an SD card interface, and/or an audio interface, or the like. The interface may electrically and/or physically connect, for example, the electronic device 400 to an external electronic device, and may include a USB connector, an SD card/an MMC connector, or an audio connector.

The battery 450 may refer, for example, to a device for supplying power to at least one component of the electronic device 400 and may include, for example, a non-rechargeable primary battery, a rechargeable secondary battery, or a fuel cell. At least a portion of the battery 450 may be disposed to be substantially flush with, for example, the printed circuit board 440. The battery 450 may be integrally disposed within the electronic device 400, or may be mounted to be detachable from the electronic device 400.

The antenna 470 may be disposed between the rear plate 480 and the display 450. The antenna 470 may include, for example, and without limitation, a near-field communication (NFC) antenna, a wireless charging antenna, and/or a magnetic secure transmission (MST) antenna, or the like. The antenna 470 is capable of, for example, and without limitation, performing short-range communication with an external device and/or transmitting and receiving power required for charging in a wireless manner, or the like. In other embodiments, an antenna structure may be formed by the side bezel structure 410, a portion of the first support member 411, or a combination thereof.

An electronic device according to various embodiments of the disclosure may include: a housing including a first plate facing a first direction (e.g., the front plate 420 in FIG. 4), a second plate (e.g., the rear plate 480 in FIG. 4) facing a direction opposite the first direction of the first plate 420, and a side member comprising a side wall surrounding the space between the first plate 420 and the second plate 480, wherein the side member includes a conductive portion (e.g., the first to third conductive portions 521 to 523 in FIG. 5); a conductive mid-plate (e.g., the mid-plate 550 in FIG. 5) disposed inside the housing parallel to the second plate, the conductive mid-plate 550 defining an opening (e.g., the dielectric gap 560 in FIG. 5) together with the conductive portion 521 to 523 when viewed from above the second plate 480; a display disposed between the conductive mid-plate 550 and the first plate 420 and being viewable through at least part of the first plate 420; a dielectric material (e.g., the dielectric material 561 in FIG. 5) filling at least part of the opening 560; a PCB 570 disposed inside the housing between the conductive mid-plate 550 and the second plate 480, the PCB 570 including a ground plane; and a capacitive structure (e.g., the capacitive structure 580 in FIG. 5) comprising a conductive material positioned between the conductive mid-plate 550 and the PCB 570 such that the dielectric material 561 is disposed between the capacitive structure 580 and the conductive portion 521 to 523, when viewed from above the second plate 480, the capacitive structure 580 including a first conductive layer attached to the conductive mid-plate 550, a second conductive layer spaced apart from the first conductive layer, and a dielectric layer interposed between the first conductive layer and the second conductive layer; and a conductive member comprising a conductive material interposed between and in contact with the second conductive layer and the PCB 570, the conductive member being electrically connected to the ground plane. The conductive mid-plate 550 may include a surface facing the second plate 480, and a recess formed on the surface, and at least part of the capacitive structure 580 may be positioned in the recess. The PCB 570 may further include a wireless communication circuit electrically connected to the conductive portion 521 to 523. The conductive portion 521 to 523 may be electrically connected to the ground plane. The capacitive structure 580 may be closer to the dielectric material than the conductive portion 521 to 523. The first conductive layer may have a first size when viewed from above the second plate 480, the second conductive layer may have a second size when viewed from above the second plate 480, the dielectric layer may have a third size when viewed from above the second plate 480, and the third size is greater than each of the first size and the second size. The first size and the second size may be substantially the same as each other. The conductive portion 521 to 523 may have a shape elongated in a first direction, and the capacitive structure 580 may have a shape elongated in the first direction. The conductive portion 521 to 523 may include a first antenna positioned on one face of the side member and configured to resonate a first RF signal, and a second antenna positioned on another face of the side member facing away from the one face of the side member and configured to resonate a second RF signal having a frequency higher than a frequency of the first RF signal. The capacitive structure 580 may include at least one first capacitive structure 580 positioned adjacent to the first antenna and having a first capacitance, and at least one second capacitive structure 580 positioned adjacent to the second antenna and having a second capacitance, in which the second capacitance is smaller than the first capacitance. The capacitive structure 580 may further include at least one third capacitive structure 580 positioned in a middle portion of the conductive mid-plate 550, and the third capacitive structure 580 is directly attached to a shield frame provided on the PCB 570. At least part of the first capacitive structure 580 and the second capacitive structure 580 may be directly attached to a metal plate of a connector provided on the PCB 570. The electronic device may further include at least one component positioned inside the opening 560 and having at least one metal plate, and at least part of the first capacitive structure 580 and the second capacitive structure 580 may be directly attached to the metal plate of the component.

An electronic device according to various embodiments of the disclosure may include: a housing including a first plate 420 facing a first direction, a second plate 480 facing a direction opposite the first direction of the first plate 420, and a side member comprising a side wall surrounding a space between the first plate 420 and the second plate 480, the side member including a conductive portion 521 to 523; a conductive mid-plate 550 disposed in the housing parallel to the second plate 480; a dielectric gap formed between the conductive portion 521 to 523 and the conductive mid-plate 550; a PCB 570 disposed inside the housing between the conductive mid-plate 550 and the second plate 480, the PCB 570 including a ground plane; and a capacitive structure 580 comprising a conductive material disposed in a boundary portion of the dielectric gap and the conductive mid-plate 550 between the conductive mid-plate 550 and the PCB 570, the capacitive structure 580 including a first conductive layer attached to the conductive mid-plate 550, a second conductive layer spaced apart from the first conductive layer and electrically connected to the ground plane, and a dielectric layer interposed between the first conductive layer and the second conductive layer. The electronic device may further include a conductive member comprising a conductive material interposed between and in contact with the second conductive layer and the PCB 570, the conductive member being electrically connected to the ground plane. The first conductive layer may have a first size when viewed from above the second plate 480, the second conductive layer may have a second size when viewed from above the second plate 480, the dielectric layer may have a third size when viewed from above the second plate 480, and the third size may be greater than each of the first size and the second size. The first size and the second size may be substantially the same as each other. The conductive portions 521 to 523 may have a shape elongated in a first direction, and the capacitive structure 580 may have a shape elongated in the direction parallel to the first direction. The conductive portion 521 to 523 may include a first antenna positioned on one face of the side member and configured to resonate a first RF signal, and a second antenna positioned on another face of the side member facing away from the one face of the side member and configured to resonate a second RF signal having a frequency higher than the frequency of the first RF signal. The capacitive structure 580 may include at least one first capacitive structure 580 positioned adjacent to the first antenna and having a first capacitance, and at least one second capacitive structure 580 positioned adjacent to the second antenna and having a second capacitance, in which the second capacitance is less than the first capacitance. The capacitive structure 580 may further include at least one third capacitive structure 580 positioned in a middle portion of the conductive mid-plate 550, and the third capacitive structure 580 may be directly attached to a shield frame provided on the PCB 570. The electronic device may further include at least one component positioned inside the dielectric gap and having at least one metal plate, and at least part of the first capacitive structure 580 and the second capacitive structure 580 may be directly attached to the metal plate of the component.

Figure 5:
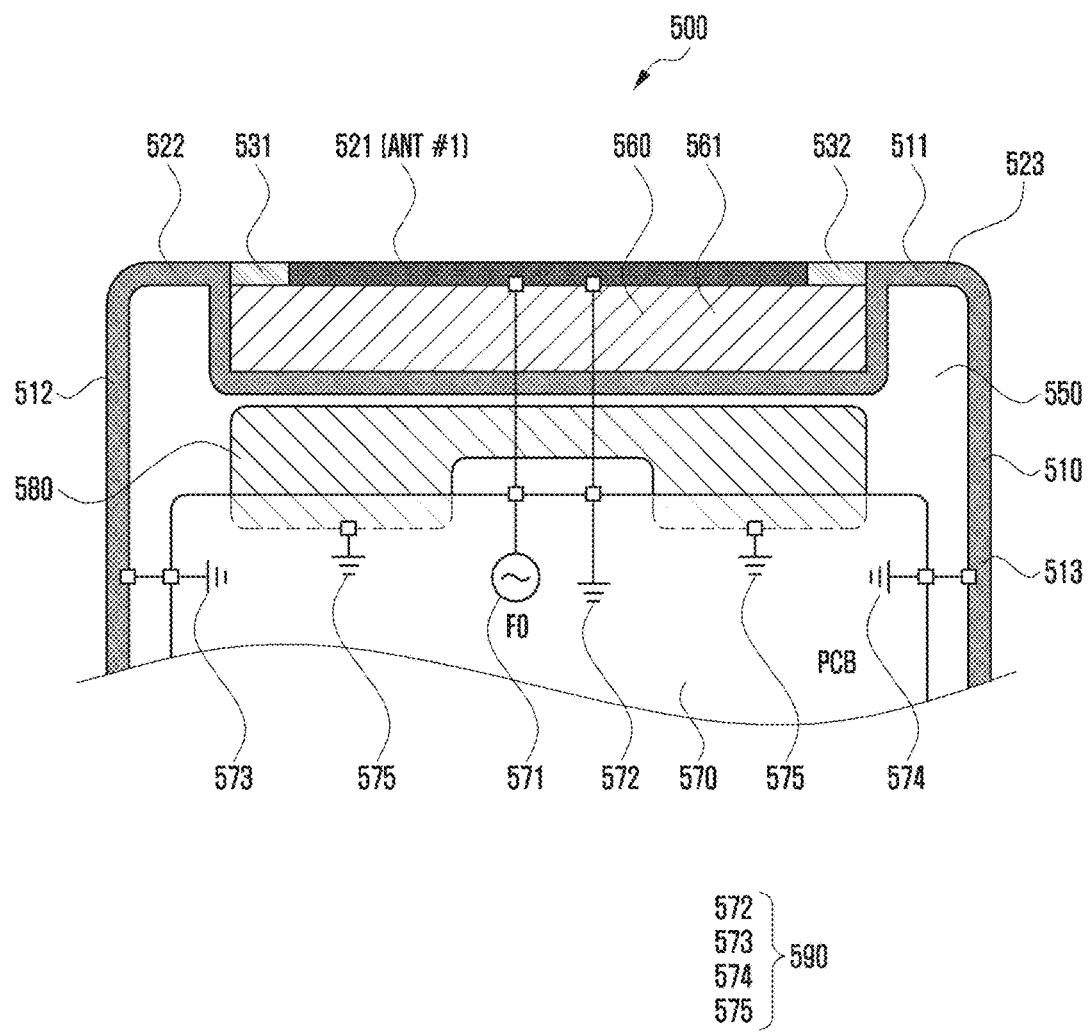
FIG. 5 is a horizontal cross-sectional view illustrating an example electronic device according to an embodiment of the disclosure.

FIG. 5 is a horizontal cross-sectional view illustrating an example electronic device according to an embodiment of the disclosure. According to an embodiment, an electronic device 500 (e.g., the electronic device 101 in FIG. 1) may include a housing (e.g., the housing 210 in FIG. 2), the housing 210 may include a first plate (e.g., the front plate 420 in FIG. 4) facing a first side (e.g., the front side) and a second plate facing a second side (e.g., the rear side) opposite the first side, and a space may be formed between the first plate 420 and the second plate 480. FIG. 5 may be a horizontal cross-sectional view illustrating the inside of the electronic device 500 according to an embodiment of the disclosure.

Referring to FIG. 5, the electronic device 500 according to an embodiment may include a side member 510 (e.g., the side bezel structure 410 in FIG. 4), a mid-plate 550 (e.g., the first support member 411 in FIG. 4), a dielectric gap 560, a PCB 570 (e.g., the PCB 440 in FIG. 4), and a capacitive structure 580.

According to an embodiment, one face of the side member 510 may include one or more conductive portions 521, 522 and 523. For example, the side member 510 may include a first face 511, a second face 512 connected to one side of the first face 511, a third face 513 connected to the other side of the first face 511, and a fourth face (not shown) facing away from the first face 511. FIG. 5 shows only the first face 511, the second face 512, and the third face 513 of the side member 510. According to an embodiment, a first conductive portion 521, a second conductive portion 522, a third conductive portion 523, a first non-conductive portion 531, and a second non-conductive portion 532 may be disposed on the first face 511 of the side member 510. According to an embodiment, the first non-conductive portion 531 may be disposed between the first conductive portion 521 and the second conductive portion 522, and the second non-conductive portion 532 may be disposed between the first conductive portion 521 and the third conductive portion 523.

According to an embodiment, the first conductive portion 521 of the side member 510 may be a radiator that radiates a first RF signal F0 output from a communication module (e.g., the communication module 190 in FIG. 1), e.g., an antenna (ANT #1) (e.g., the antenna module 197 in FIG. 1).

According to an embodiment, the RF signal output from the communication module 190 may include a first RF signal F0 or a second RF signal. According to an embodiment, the first RF signal F0 may be a signal related to a low-frequency band, and the second RF signal may be a signal related to mid-frequency and high-frequency bands. For example, the first RF signal F0 may have a communication frequency in a low or mid band (low band: ~1 GHz, mid band: ~2.1 GHz), and the second RF signal may have a communication frequency in a high or ultra-high band (high band: ~2.7 GHz, ultra-high band: ~3.5 GHz). According to some embodiments, the second RF signal may be a signal intended for Bluetooth or Wi-Fi communication in a 2.4 GHz or 5 GHz industrial scientific and medical equipment (ISM) band.

According to an embodiment, the first conductive portion 521 of the side member 510 may be a first antenna (ANT #1) configured to resonate the first RF signal F0 output from the communication module 190. According to an embodiment, the first antenna (ANT #1) is configured as a planar inverted F antenna (PIFA) type antenna, and may be electrically connected to one feeding 571 and at least one ground (e.g., the first ground 572) of the PCB 570.

According to an embodiment, the second conductive portion 522 and the third conductive portion 523 of the side member 510 may be electrically connected to one or more grounds 573 and 574 of the PCB 570, respectively. For example, the second conductive portion 522 may be formed to extend to the second side 512 of the side member 510, and may be electrically connected to the second ground 573 of the PCB 512 on the second face 512 of the side member 510. The third conductive portion 523 may be formed to extend to the third side 513 of the side member 510, and may be electrically connected to the third ground 574 of the PCB 570 on the third face 513 of the side member 510.

According to an embodiment, the mid-plate 550 is disposed in the housing 210 parallel to the first plate 420 or the second plate 480. According to an embodiment, the mid-plate 550 is spaced apart from the first conductive portion 521 when viewed from above the second plate 480, and may define a dielectric gap 560 (or an opening) between the mid-plate 550 and the first conductive portion 521. For example, a dielectric gap 560 may be formed between the first conductive portion 521 and the mid-plate 550, and the dielectric gap 560 may be filled with a dielectric material 561. According to an embodiment, the dielectric material 561 may be an injection-molded product of a non-conductive material (e.g., plastic).

According to an embodiment, the PCB 570 may include one feed 571 connected to the communication module 190, and multiple grounds 590. According to an embodiment, the communication module 190 may send a first RF signal F0 by transmitting the first RF signal F0 to the first antenna (ANT #1) through the feeding 571 formed on the printed circuit board 570, or may receive current through the first antenna (ANT #1) and the feeding 571.

According to an embodiment, the multiple grounds 590 of the PCB 570 are connected to the first conductive portion 521, the second conductive portion 522, and/or the third conductive portion 523, and may also be connected to the capacitive structure 580. For example, the multiple grounds 590 may include first to third grounds 572, 573 and 574 and at least one fourth ground 575, in which the first ground 572 may be electrically connected to the first conductive portion 521, the second ground 573 may be electrically connected to the second conductive portion 522, the third ground 574 may be electrically connected to the third conductive portion 523, and the at least one fourth ground 575 may be electrically connected to the capacitive structure 580, but the disclosure is not limited thereto.

According to an embodiment, the capacitive structure 580 may be configured to block a conductive path causing an image current by being attached to the rear face of the mid-plate 550. For example, the capacitive structure 580 may be positioned in the housing 210 between the mid-plate 550 and the PCB 570 and attached to the rear face of the mid-plate 550. According to an embodiment, the capacitive structure 580 may be positioned adjacent to the first conductive portion 521. For example, the capacitive structure 580 may be positioned adjacent to the first ground 572, which is electrically connected to the feeding 571 of the PCB 570, or the first conductive portion 521. According to some embodiments, the capacitive structure 580 may be positioned at the boundary portion of the dielectric gap 560 and the mid-plate 550 in order to minimize and/or reduce the conductive path that causes an image current. According to an embodiment, the first conductive portion 521 may have a shape elongated in a first direction (e.g., the transverse direction in FIG. 5), and the capacitive structure 580 may also have a shape elongated in the first direction. For example, the capacitive structure 580 may be formed parallel to the first conductive portion 521.

One face (e.g., the front face) of the capacitive structure 580 may be electrically connected to the mid-plate 550, and the other face (e.g., the rear face) of the capacitive structure 580 may be electrically connected to the fourth ground 575 of the PCB 570.

Figure 6:
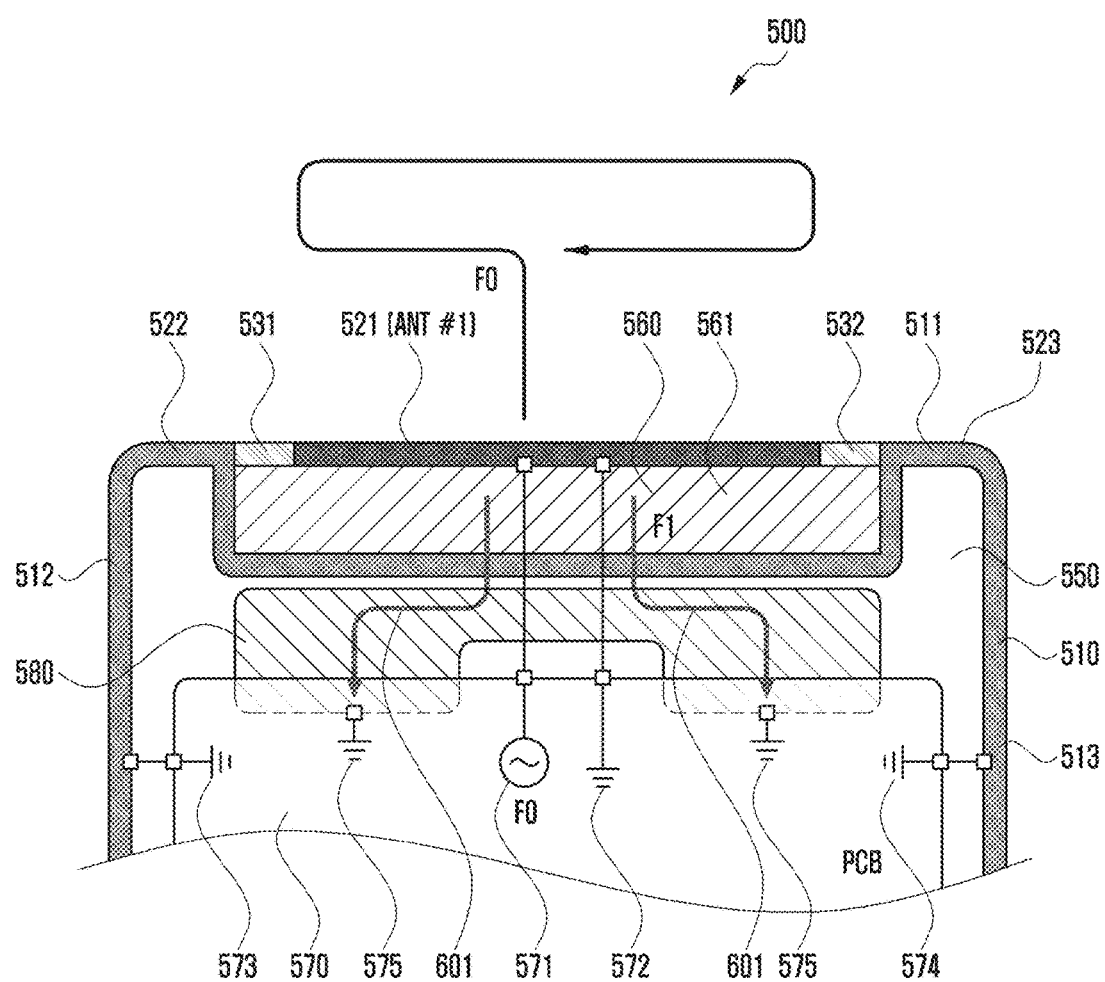
FIG. 6 is diagram illustrating an example process in which a capacitive structure disposed on a mid-plate blocks a conductive path causing an antenna image current according to an embodiment of the disclosure.

FIG. 6 is a diagram illustrating an example process in which a capacitive structure disposed on a mid-plate blocks a conductive path causing an antenna image current according to an embodiment of the disclosure.

Referring to FIG. 6, the capacitive structure 580 may be positioned between the mid-plate 550 and the PCB 570, so that the fourth ground 575 of the mid-plate 550 and the PCB 570 can be electrically connected.

According to an embodiment, while the electronic device 500 outputs the first RF signal F0 through the antenna, an image current 601 (F1) corresponding to the electric field generated by the first antenna (ANT #1) may be induced in the mid-plate 550 disposed in the housing 210 to face the first antenna (ANT #1). For example, the image current 601 (F1) may be generated at the boundary portion of the mid-plate 550 and the dielectric gap 560 through the dielectric gap 560, and the generated image current 601 (F1) may be absorbed (or removed) to the fourth ground 575 of the PCB 570 via the capacitive structure 580.

Figure 7A:
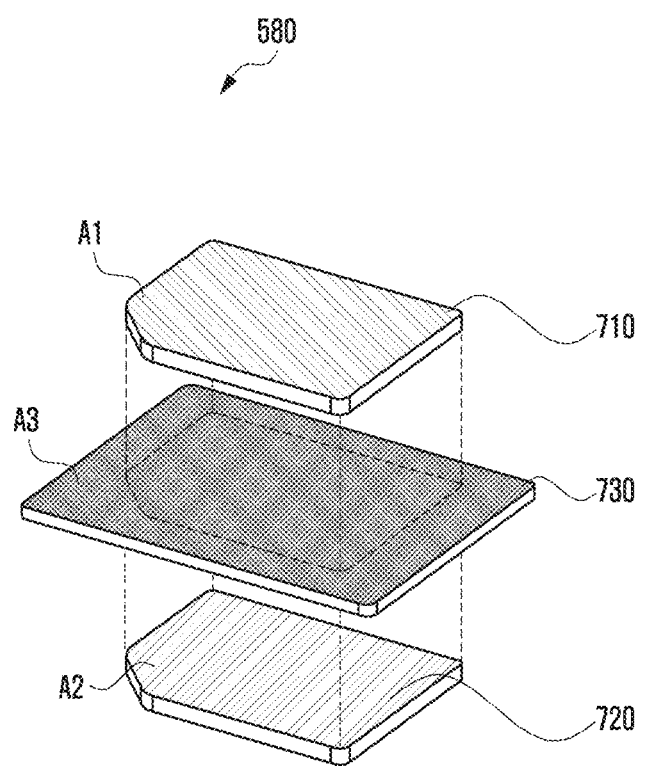
FIG. 7A is a diagram illustrating an example configuration of a capacitive structure according to an embodiment of the disclosure.
Figure 7B:
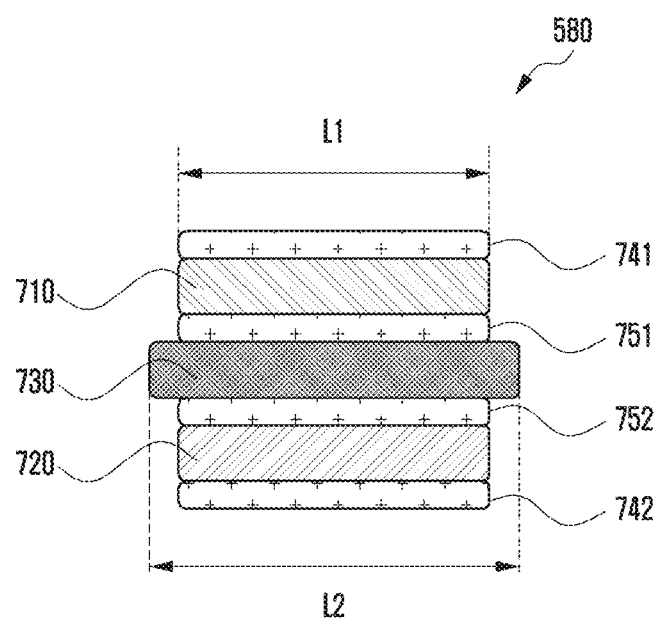
FIG. 7B is a diagram illustrating an example configuration of a capacitive structure according to an embodiment of the disclosure.

FIG. 7A is a diagram illustrating an example configuration of a capacitive structure according to an embodiment of the disclosure. FIG. 7B is a diagram illustrating an example configuration of a capacitive structure according to an embodiment of the disclosure. For example, FIG. 7A is an exploded perspective view of a capacitive structure according to an embodiment of the disclosure, and FIG. 7B is a sectional view of a stacked capacitive structure according to an embodiment of the disclosure.

Referring to FIGS. 7A and 7B, a capacitive structure (e.g., the capacitive structure 580 in FIG. 5) may include a first conductive layer 710 attached to a mid-plate (e.g., the mid-plate 550 in FIG. 5), a second conductive layer 720 positioned to be spaced apart from the first conductive layer 710 and to face the PCB (e.g., the PCB 570 in FIG. 5), and a dielectric layer 730 disposed between the first conductive layer 710 and the second conductive layer 720.

According to an embodiment, the first conductive layer 710 may be formed of a first conductive film, and the second conductive layer 720 may be formed of a second conductive film. For example, the first conductive film may comprise a copper-based material and the second conductive film may comprise a nickel-based material.

According to an embodiment, one surface (e.g., the front face) of the first conductive layer 710 may be attached to the mid-plate 550 by a first conductive adhesive 741, and the other face (e.g., the rear face) of the first conductive layer 710 may be attached to the dielectric layer 730 by a first adhesive 751. One face (e.g., the front face) of the second conductive layer 720 may be attached to the dielectric layer 730 by a second adhesive 752, and the other face (e.g., the rear face) of the second conductive layer 720 may be electrically connected to a ground (e.g., the fourth ground 575 in FIG. 5) of the PCB 570 by a second conductive adhesive 742. According to an embodiment, the second conductive layer 720 may be electrically connected to a ground plane (e.g., the fourth ground 575 in FIG. 5) of the PCB 570 via a conductive member (e.g., a C-clip).

According to an embodiment, the size of the dielectric layer 730 may be larger than the size of the first conductive layer 710 and the size of the second conductive layer 720. For example, when viewing the cross section of the capacitive structure 580, the width L2 of the dielectric layer 730 is greater than the width L1 of the first conductive layer 710 and the width L1 of the second conductive layer 720. When the capacitive structure 580 is viewed from above the second plate, the size of the dielectric layer 730 may be greater than the size of the first conductive layer 710 and the size of the second conductive layer 720. For example, the first conductive layer 710 may have a first size A1 when viewed from above the second plate, the second conductive layer 720 may have a second size A2 when viewed from above the second plate, the dielectric layer 730 may have a third size A3 when viewed from above the second plate, and the third size A3 may be greater than each of the first size A1 and the second size A2. In the capacitive structure 580 according to an embodiment of the disclosure, the size of the dielectric layer 730 may be greater than the size of the first conductive layer 710 and the size of the second conductive layer 720, to avoid a short circuit between the conductive layer 710 and the second conductive layer 720 and a substantially constant capacitance can be obtained even when the ambient environment changes (e.g., a temperature change, or a pressure increase). According to an embodiment, each of the sizes A1 and A2 of the first and second conductive layers 710 and 720 may be substantially the same as each other such that the capacitive structure 580 has a constant capacitance.

According to an embodiment, the size of the capacitive structure 580 may be a factor in determining the capacitance of the capacitive structure 580. For example, the area or thickness of the capacitive structure 580 may be designed to have a predetermined capacitance corresponding to the resonant frequency of an antenna adjacent to the capacitive structure 580. According to some embodiments, the capacitive structure 580 may be designed to have a predetermined capacitance to block noise (e.g., electromagnetic interference (EMI)) due to, for example, an electronic component disposed around the capacitive structure 580. According to an embodiment, the electronic component may include, for example, sensor modules (e.g., the sensor modules 204, 216, and 219 in FIG. 2), camera modules (e.g., the camera modules 205, 212, and 213 in FIG. 2), or a processor (e.g., the processor 120 in FIG. 1).

Figure 8:
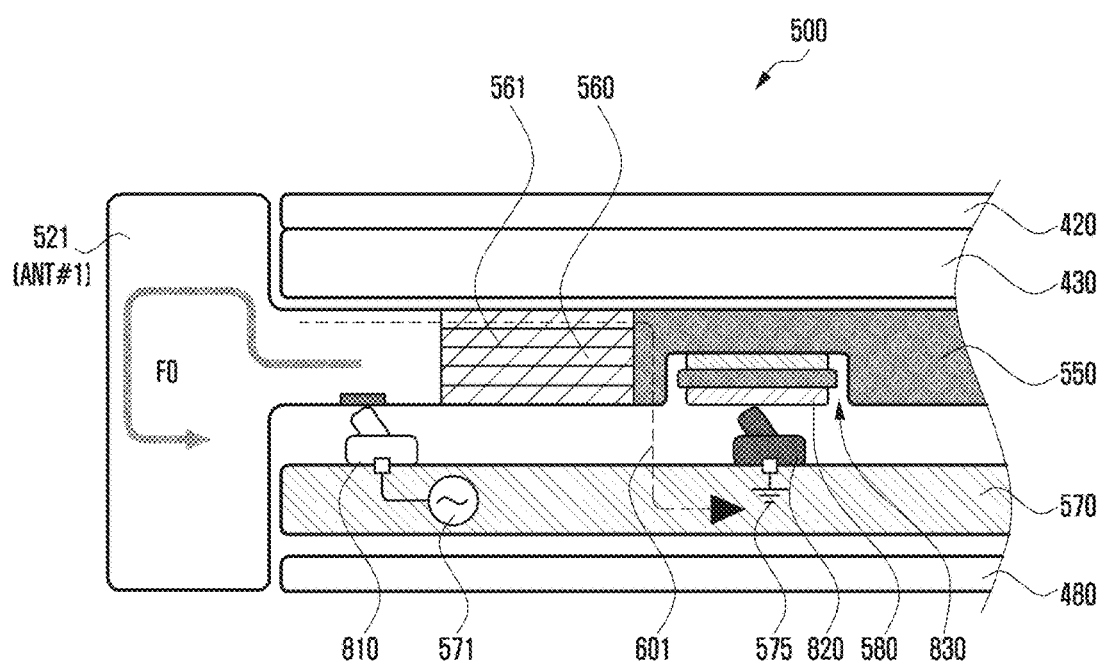
FIG. 8 is a vertical cross-sectional view illustrating a portion of an example electronic device according to an embodiment of the disclosure.
Figure 9:
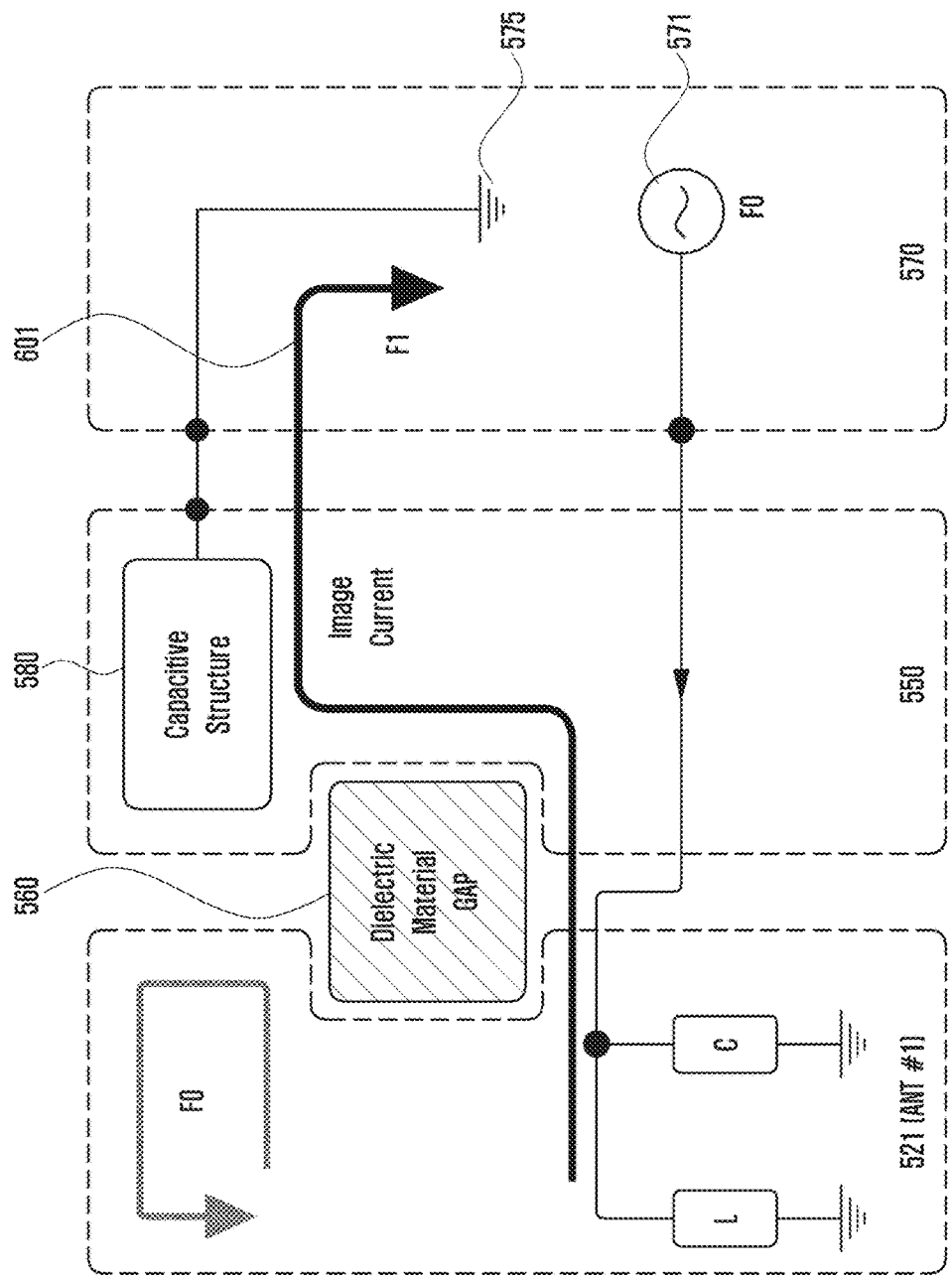
FIG. 9 is an diagram illustrating an example ground design structure of an electronic device that blocks a conductive path causing an image current according to an embodiment of the disclosure.

FIG. 8 is a vertical cross-sectional view illustrating a portion of an example electronic device according to an embodiment of the disclosure. FIG. 9 is an diagram illustrating an example ground design structure of an electronic device according to an embodiment of the disclosure that blocks a conductive path causing an image current.

Referring to FIGS. 8 and 9, an electronic device (e.g., the electronic device 500 in FIG. 5) according to an embodiment of the disclosure includes a first plate (e.g., the front plate 420 in FIG. 4) facing a first side (e.g., the front side), a second plate (e.g., the rear plate 480 in FIG. 4) facing a second side (e.g., the rear side) opposite the first side, and a side member (e.g., the side member 510 in FIG. 5) that surrounds the space between the first plate 420 and the second plate 480. According to an embodiment, in the space between the first plate 420 and the second plate 480, a display (e.g., the display 430 in FIG. 4), a mid-plate (e.g., the mid-plate 550 in FIG. 5), and a PCB (e.g., the PCB 570 in FIG. 5) may be positioned.

According to an embodiment, the display 430 may be positioned on one face (e.g., the front face) of the mid-plate 550 and the PCB 570 may be positioned on the other face (e.g., the rear face) of the mid-plate 550. According to an embodiment, between the mid-plate 550 and the first conductive portion (e.g., the first conductive portion 521 in FIG. 5) of the side member 510, a dielectric gap (e.g., the dielectric gap 560 in FIG. 5), which is filled with a dielectric material (e.g., the dielectric material 561 in FIG. 5), may be positioned. According to an embodiment, the dielectric gap 560 may have a length and width corresponding to those of the dielectric material 561 positioned between the mid-plate 550 and the first conductive portion 521.

According to an embodiment, the first conductive portion 521 of the side member 510 may be a first antenna (ANT #1) (e.g., the first antenna #1 in FIG. 5) configured to resonate the first RF signal (e.g., the first RF signal F0) output from the communication module 190 (e.g., the communication module 190 in FIG. 1). According to an embodiment, the first antenna (ANT #1) may be configured as a planar inverted F antenna (PIFA) type antenna, and may be electrically connected to one feeding (e.g., the feeding 571 in FIG. 5) and at least one ground (e.g., the first ground 572 in FIG. 5) of the PCB 570. According to an embodiment, the first antenna (ANT #1) may be electrically connected to one feeding 571 of the PCB 570 via a first conductive member (e.g., a C-clip) 810.

According to an embodiment, a capacitive structure (e.g., the capacitive structure 580 in FIG. 5) may be positioned between the mid-plate 550 and the PCB 570, and the capacitive structure 580 may be attached to the mid-plate 550. According to an embodiment, the capacitive structure 580 may be positioned adjacent to the boundary portion of the dielectric material 561 and the mid-plate 550.

According to an embodiment, the mid-plate 550 may include a recess 830 in the face facing the second plate 480, and the capacitive structure 580 may be positioned inside the recess 830. For example, the mid-plate 550 have the recess 830 formed in the face facing the PCB 570 in a portion adjacent to the boundary between the dielectric material 561 and the mid-plate 550. According to an embodiment, since the capacitive structure 580 is attached to the inside of the recess 830 in the mid-plate 550, a step due to the attachment of the capacitive structure 580 may not be formed on the surface of the mid-plate 550 facing the PCB 570.

According to an embodiment, the capacitive structure 580 may be electrically connected to a ground (e.g., the fourth ground 575 in FIG. 5) of the PCB 570 via a second conductive member (e.g., a C-clip) 820.

According to an embodiment, when the electronic device 500 outputs a first RF signal F0 through the first conductive portion 521, which is the first antenna (ANT #1), an electric field may be generated by the antenna (ANT #1). When an electric field is generated by the first antenna (ANT #1), in the mid-plate 550 disposed to face the first conductive portion 521, an image current (e.g., the image current 601 in FIG. 6) corresponding to the electric field may be induced. The induced image current 601 may be generated at the boundary portion of the mid-plate 550 and the dielectric gap 560 through the dielectric gap 560, and the generated image current 601 may be absorbed (or removed) to the fourth ground 575 of the PCB 570 via the capacitive structure 580 and the second conductive member (e.g., a C-clip) 820.

Figure 10:
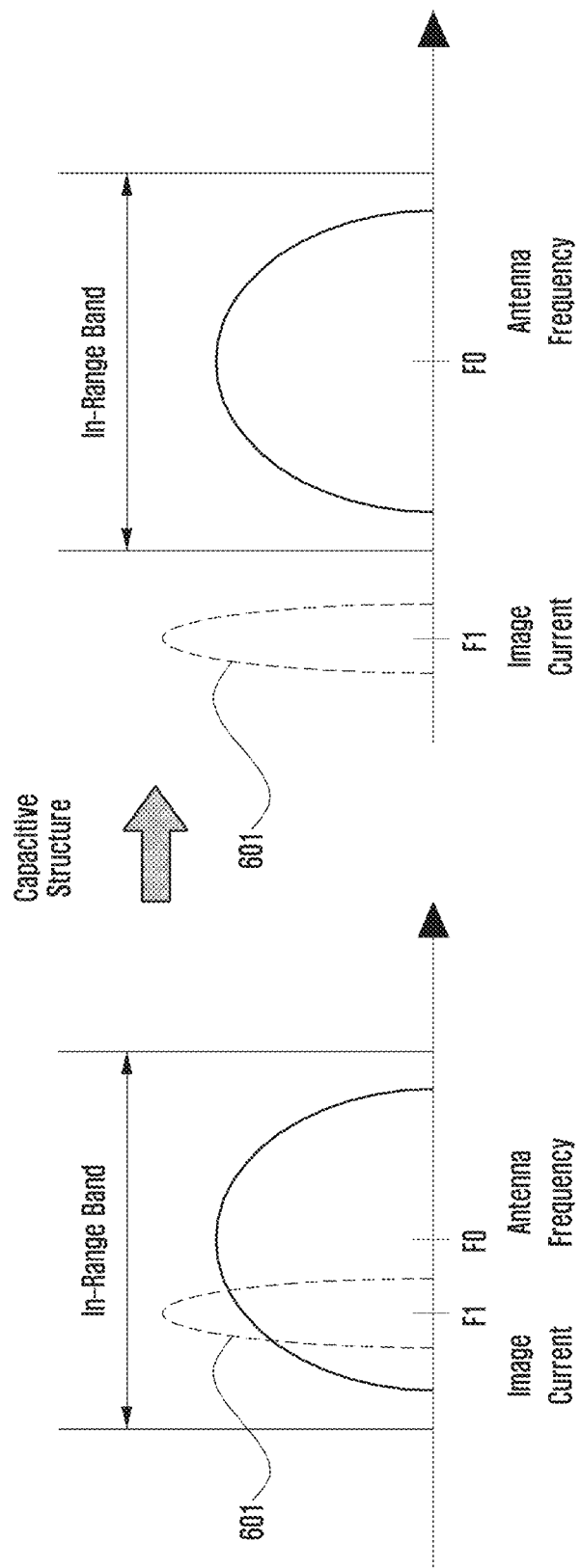
FIG. 10 is an diagram illustrating an effect of shifting, by a capacitive structure, a parasitic resonant frequency band generated by an image current according to an embodiment of the disclosure.

FIG. 10 is an diagram illustrating an effect of shifting, by a capacitive structure, a parasitic resonant frequency band generated by an image current according to an embodiment of the disclosure.

As described above, the capacitive structure (e.g., the capacitive structure 580 in FIG. 5) according to an embodiment of the disclosure may be configured to discharge an image current (e.g., the image current 601 in FIG. 6), which may be induced in the mid-plate (e.g., the mid-plate 550 in FIG. 5), to a ground (e.g., the fourth ground 575 in FIG. 5) of the PCB (e.g., the PCB 570 in FIG. 5). The capacitive structure 580 may be configured to move a parasitic resonant frequency band generated by the image current 601. For example, the image current 601 may form an induced electric field when encountering a particular structure within the housing (e.g., the housing 210 in FIG. 2) while rotating along the mid-plate 550, and the formed induced electric field may have a resonant frequency band similar to an electric field generated by the first antenna (ANT #1). In the electronic device 500 (e.g., the electronic device 500 in FIG. 5) according to an embodiment of the disclosure, the capacitive structure 580 is positioned at the boundary portion of the mid-plate 550 and the dielectric gap 560, so that the parasitic resonant frequency band F1 generated by the image current (e.g., the image current 610 in FIG. 6) can be shifted to a band different from the resonant frequency band F0 of the first antenna (ANT #1). For example, the capacitance of the capacitive structure 580 may be designed to shift the parasitic resonant frequency band F1 out of the resonant frequency band F0 of the first antenna (ANT #1).

Referring to the left graph in FIG. 10, assuming that the resonant frequency band of the antenna is within a predetermined range, before the capacitive structure 580 is attached to the mid-plate 550, the resonant frequency band F1 generated by the image current 601 may be positioned in the resonant frequency band F0 of the first antenna (ANT #1). On the other hand, referring to the right graph in FIG. 10, after the capacitive structure 580 is attached to the mid-plate 550, the resonant frequency band F1 generated by the image current 601 may be shifted out of the resonant frequency band F0 of the first antenna (ANT #1) due to the capacitance of the capacitance structure 580, and as a result, it is possible to prevent and/or reduce deterioration of the performance of the first antenna (ANT #1) due to parasitic resonance F1.

According to various embodiments of the disclosure, the electronic device (e.g., the electronic device 500 in FIG. 5) may include multiple capacitive structures (e.g., the capacitive structure 580 in FIG. 5). For example, at least one capacitive structure 580 may be disposed on each of one side portion in which the first antenna (e.g., the first antenna (ANT #1) in FIG. 5), another side portion in which the second antenna facing the first antenna (e.g., the first antenna (ANT #1) in FIG. 5), and a middle portion when the electronic device 500 is viewed from above the second plate (e.g., the rear plate 480 in FIG. 4). According to an embodiment, each of the multiple capacitive structures 580 may have a capacitance (e.g., a size) that may be designed in consideration of a resonant frequency band of an adjacent antenna or noise (e.g., electromagnetic interference (EMI)) caused due to an adjacent electronic component, and thus the multiple capacitive structures may have different sizes and different capacitances, respectively. Hereinafter, descriptions will be made in greater detail with reference to FIGS. 11 and 12.

Figure 11:
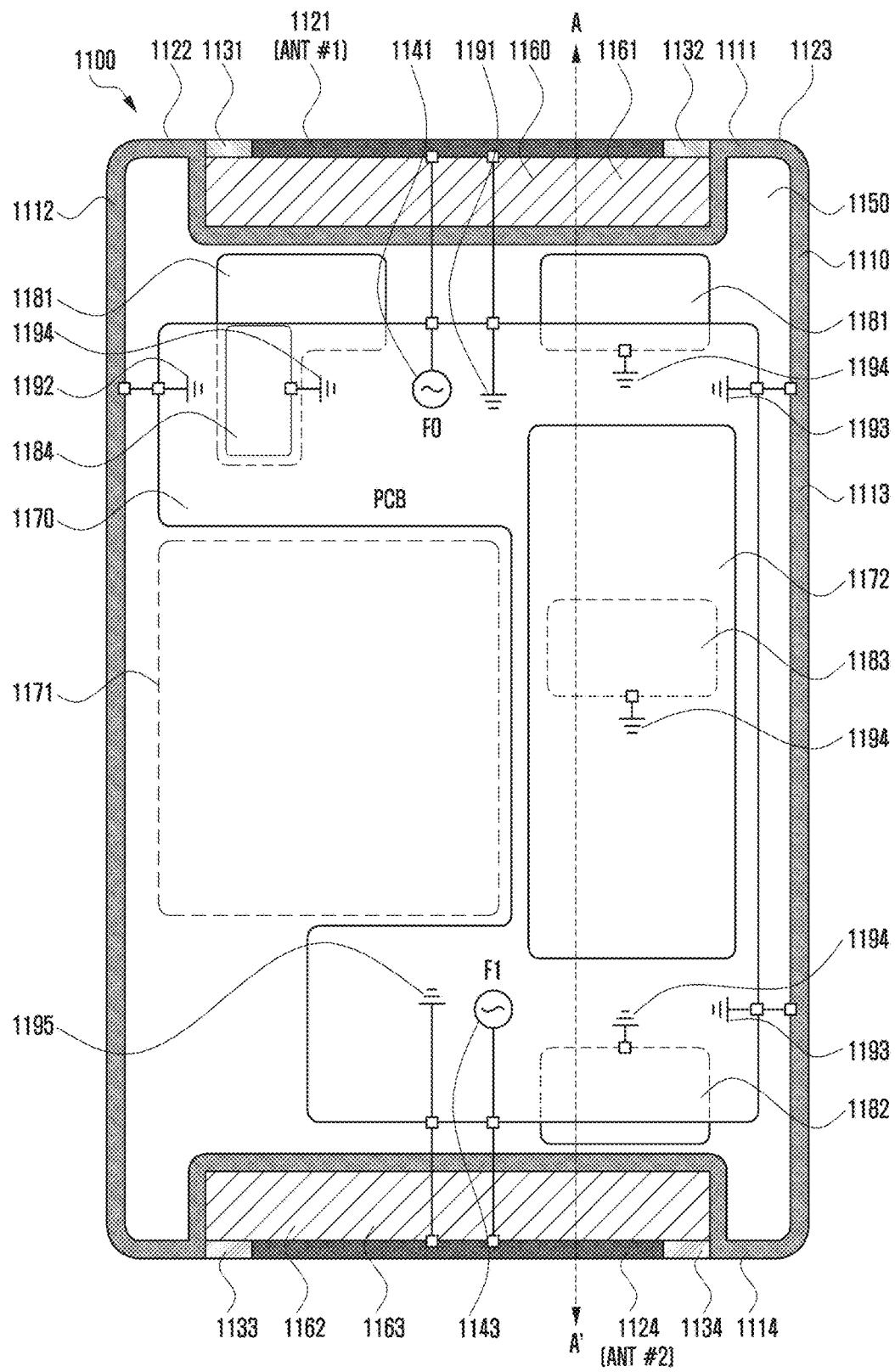
FIG. 11 is a horizontal cross-sectional view illustrating an example electronic device according to an embodiment of the disclosure.

FIG. 11 is a horizontal cross-sectional view illustrating an example electronic device according to an embodiment of the disclosure.

Referring to FIG. 11, an electronic device 1100 (e.g., the electronic device 500 in FIG. 5) according to an embodiment may include a side member 1110 (e.g., the side member 510 in FIG. 5), a mid-plate 1150 (e.g., the mid-plate 550 in FIG. 5), multiple dielectric gaps 1160 and 1162 (e.g., the dielectric gap 560 in FIG. 5), a PCB 1170 (e.g., the PCB 570 in FIG. 5), and multiple capacitive structures 1181, 1182, and 1183 (e.g., the capacitive structure 580 in FIG. 5).

The side member 1110 may include a first face 1111, a second face 1112 connected to one side of the first face 1111, a third face 1113 connected to the other side of the first face 1111, and a fourth face 1114 facing away from the first face 1111.

According to an embodiment, a first conductive portion 1121 (ANT #1), a second conductive portion 1122, a third conductive portion 1123, a first non-conductive portion 1131, and a second non-conductive portion 1132 may be disposed on the first face 1111 of the side member 1110. According to an embodiment, the first non-conductive portion 1131 may be disposed between the first conductive portion 1121 (ANT #1) and the second conductive portion 1122, and the second non-conductive portion 1132 may be disposed between the first conductive portion 1121 (ANT #1) and the third conductive portion 1123.

According to an embodiment, the second conductive portion 1122, the third conductive portion 1123, the fourth conductive portion 1124 (ANT #2), a third non-conductive portion 1133, and a fourth non-conductive portion 1134 may be disposed on the fourth face 1114 of the side member 1110. According to an embodiment, the third non-conductive portion 1133 may be disposed between the second conductive portion 1122 and the fourth conductive portion 1124 (ANT #2), and the fourth non-conductive portion 1134 may be disposed between the fourth conductive portion 1124 (ANT #2) and the third conductive portion 1123. According to an embodiment, the fourth non-conductive portion 1134 may be positioned to face away from the first non-conductive portion 1131 and a second non-conductive portion 1132 when the electronic device 1100 is viewed from above the second plate (e.g., the rear plate 480 in FIG. 4).

According to an embodiment, the second conductive portion 1122 and the third conductive portion 1123 of the side member 1110 may be electrically connected to one or more grounds 1192 and 1193 of the PCB 1170. For example, the second conductive portion 1122 may be formed to extend to the fourth face 1114 of the side member 1110 via the second face 1112 of the side member 1110, and may be electrically connected to the second ground 1192 of the PCB 1170 on the second face 1112 of the side member 1110. The third conductive portion 1123 may be formed to extend to the fourth face 1114 of the side member 1110 via the third face 1113 of the side member 1110, and may be electrically connected to the third ground 1193 of the PCB 1170 on the third face 1113 of the side member 1110.

According to an embodiment, a first dielectric gap 1160 filled with a first dielectric material may be positioned between the mid-plate 1150 and the first conductive portion 1121 (ANT #1) of the side member 1110, and a second dielectric gap 1162 filled with a second dielectric material 1163 may be positioned between the mid-plate 1150 and the fourth conductive portion 1124 (ANT #2) of the side member 1110. According to an embodiment, the first dielectric gap 1160 may have a length and width corresponding to those of the first dielectric material positioned between the mid-plate 1150 and the first conductive portion 1121 (ANT #1), and the second dielectric gap 1162 may have a length and width corresponding to those of the second dielectric material 1163 positioned between the mid-plate 1150 and the fourth conductive portion 1124 (ANT #2).

According to an embodiment, the first conductive portion 1121 (ANT #1) of the side member 1110 may be the first antenna (ANT #1) configured to resonate the first RF signal F0 output from a communication module (e.g., the communication module 190 in FIG. 1), and the fourth conductive portion 1124 (ANT #2) of the side member 1110 may be the second antenna (ANT #2) configured to resonate the second RF signal F1 output from the communication module 190. According to an embodiment, the first RF signal F0 and the second RF signal F1 may be signals related to a low-frequency band. According to another embodiment, the first RF signal F0 and the second RF signal F1 may be signals related to different frequencies. For example, the first RF signal F0 may have a communication frequency in a low or mid band (low band: ~1 GHz, mid band: ~2.1 GHz), and the second RF signal F1 may have a communication frequency in a high or ultra-high band (high band: ~2.7 GHz, ultra-high band: ~3.5 GHz). According to some embodiments, the second RF signal may be a signal intended for Bluetooth or Wi-Fi communication of a 2.4 GHz or 5 GHz industrial scientific and medical equipment (ISM) band.

According to an embodiment, each of the first antenna (ANT #1) and the second antenna (ANT #2) is configured as a planar inverted F antenna (PIFA) type antenna, and may be electrically connected to one feeding 571 and one or more grounds 1191 and 1195 of the PCB 1170.

According to an embodiment, when viewed from above the second plate 480, the mid-plate 1150 is spaced apart from each of the first conductive portion 1121 (ANT #1) and the fourth conductive portion 1124 (ANT #2), and may define a first dielectric gap 1160 (or a first opening) between the mid-plate 1150 and the first conductive portion 1121 and a second dielectric gap 1162 (or a second opening) between the mid-plate 1150 and the fourth conductive portion 1124. According to an embodiment, each of the first dielectric material 1161 and the second dielectric material 1163 may be an injection-molded product of a non-conductive material (e.g., plastic).

According to an embodiment, the PCB 1170 may have a shape elongated in a direction parallel to the second face 1112 or the third face 1113 of the side member 1110, and may have, in the middle portion thereof, a battery slot 1171 configured to accommodate a battery (e.g., the battery 450 in FIG. 4) therein.

According to an embodiment, the PCB 1170 may include a first feeding 1141 and a second feeding 1143 connected to the communication module 190 and/or multiple grounds 1191, 1192, 1193, 1194, and 1195. According to an embodiment, the communication module 190 may send a first RF signal F0 by transmitting the first RF signal F0 to the first antenna (ANT #1) through the first feeding 1141 formed on the PCB 1170, or may receive current through the first antenna (ANT #1) and the first feeding 1141. The communication module 190 may send a second RF signal F1 by transmitting the second RF signal F1 to the second antenna (ANT #2) through the second feeding 1143 formed on the PCB 1170, or may receive current through the second antenna (ANT #2) and the second feeding 1143.

According to an embodiment, the multiple grounds 1191, 1192, 1193, 1194, and 1195 of the PCB 1170 are connected to the first conductive portion 1121 (ANT #1), the second conductive portion 1122, and the third conductive portion 1123, and may also be connected to the multiple capacitive structures 1181, 1182, and 1183. For example, the multiple grounds 1191, 1192, 1193, 1194, and 1195 may include first to fourth grounds 1191, 1192, 1193, and 1195 and multiple fifth grounds 1194, in which the first ground 1191 may be electrically connected to the first conductive portion 1121 (ANT #1), the second ground 1192 may be electrically connected to the second conductive portion 1122, the third ground 1193 may be electrically connected to the third conductive portion 1123, the fourth ground 1195 may be electrically connected to the fourth conductive portion 1124 (ANT #2), and each of the multiple fifth grounds is electrically connected to one of the multiple capacitive structures 1181, 1182, and 1183. According to some embodiments, multiple ones selected from the multiple fifth grounds 1194 may be connected to one capacitive structure 1181, 1182, or 1183.

According to an embodiment, the multiple capacitive structures 1181, 1182, and 1183 may include at least one first capacitive structure 1181 positioned adjacent to the first conductive portion 1121 (ANT #1), at least one second capacitive structure 1182 positioned adjacent to the second conductive portion 1122, and at least one third capacitive structure 1183 that overlaps the PCB 1170 when viewed from above the second plate 480 and is positioned in the middle portion of the mid-plate 1150.

According to an embodiment, the electronic device 1100 may include multiple first capacitive structures 1181, some of which may be connected to a fifth ground 1194 by being attached to a metal plate 1184 formed on a connector of the PCB (e.g., the PCB 570 in FIG. 8).

According to an embodiment, the first capacitive structure 1181 may be configured to block the conductive path of a first image current (see "1202" in FIG. 12) (e.g., the image current 601 in FIG. 6) generated by resonance of the first antenna (ANT #1), or may be configured to shift the parasitic resonant frequency band of the first image current 1202 to a band different from the resonant frequency band of the first antenna (ANT #1) by being designed to have a predetermined capacitance. According to an embodiment, one face (e.g., the front face) of the first capacitive structure 1181 may be electrically connected to the mid-plate 1150, and the other face (e.g., the rear face) of the first capacitive structure may be electrically connected to at least one of the multiple fifth grounds 1194 of the PCB 1170.

According to an embodiment, the first capacitive structure 1181 may be positioned at the boundary portion of the first dielectric gap 1160 and the mid-plate 1150 in order to minimize and/or reduce the conductive path that causes the first image current 1202, and may be formed in a single piece having a shape elongated in a direction parallel to the first antenna (ANT #1). Alternatively, there may be provided multiple first capacitive structures 1181, which are positioned at the boundary portion of the first dielectric gap 1160 and the mid-plate 1150 and are arranged in a direction parallel to the first antenna (ANT #1). FIG. 11 illustrates that two first capacitive structures 1181 are positioned in a direction parallel to the first antenna (ANT #1), by way of example.

According to an embodiment, the second capacitive structure 1182 may be configured to block the conductive path of a second image current (see the image current 1204 in FIG. 12) generated by resonance of the second antenna (ANT #2), or may be configured to shift the parasitic resonant frequency band of the second image current 1204 to a band different from the resonant frequency band of the second antenna (ANT #2) by being designed to have a predetermined capacitance. According to an embodiment, one face (e.g., the front face) of the second capacitive structure 1182 may be electrically connected to the mid-plate 1150, and the other face (e.g., the rear face) of the second capacitive structure 1182 may be electrically connected to at least one of the multiple fifth grounds 1194 of the PCB 1170.

According to an embodiment, the second capacitive structure 1182 may be positioned at the boundary portion of the dielectric gap 1162 and the mid-plate 1150 in order to minimize and/or reduce the conductive path that causes the second image current 1204.

According to an embodiment, the third capacitive structure 1183 may be positioned in the middle portion of the mid-plate 1150 such that the middle portion of the mid-plate 1150 has a designed ground. For example, the third capacitive structure 1183 may be positioned in the middle portion of the mid-plate 1150, so that noise (e.g., electromagnetic interference (EMI)) generated internally in the electronic device 1100 or introduced from the outside can be bypassed to the ground (e.g., the fifth ground) of the PCB 1170. According to some embodiments, when viewed from above the second plate 480, the third capacitive structure 1183 may be positioned in a portion that overlaps a shield frame structure 1172 (e.g., a shield can) positioned in the middle portion of the printed circuit board 1170. According to an embodiment, the shield frame structure 1172 is a metal structure for shielding heat or electromagnetic waves generated from electronic components coupled to the PCB 1170, and may be a structure coupled to the PCB 1170 while covering, for example, a processor (e.g., the processor 120 in FIG. 1).

According to an embodiment, each of the first capacitive structure 1181, the second conductive structure 1182, and the third capacitive structure 1183 may have a capacitance e.g., a size) that may be designed in consideration of a resonant frequency band of an adjacent antenna or noise (e.g., electromagnetic interference (EMI)) caused due to an adjacent electronic component, and a design margin, and thus the first to third capacitive structures may have different sizes and different capacitances, respectively. For example, assuming that the first RF signal F0 is a signal related to a low-frequency band and the second RF signal F1 is a signal related to a mid-frequency and high-frequency band, the first capacitive structure 1181 positioned adjacent to the first antenna (ANT #1) may be designed to have a first capacitance (e.g., about 160 pF), and the second capacitive structure 1182 positioned adjacent to the second antenna (ANT #2) may be designed to have a second capacitance (e.g., about 40 pF) that is less than the first capacitance (e.g., about 160 pF).

Figure 12:
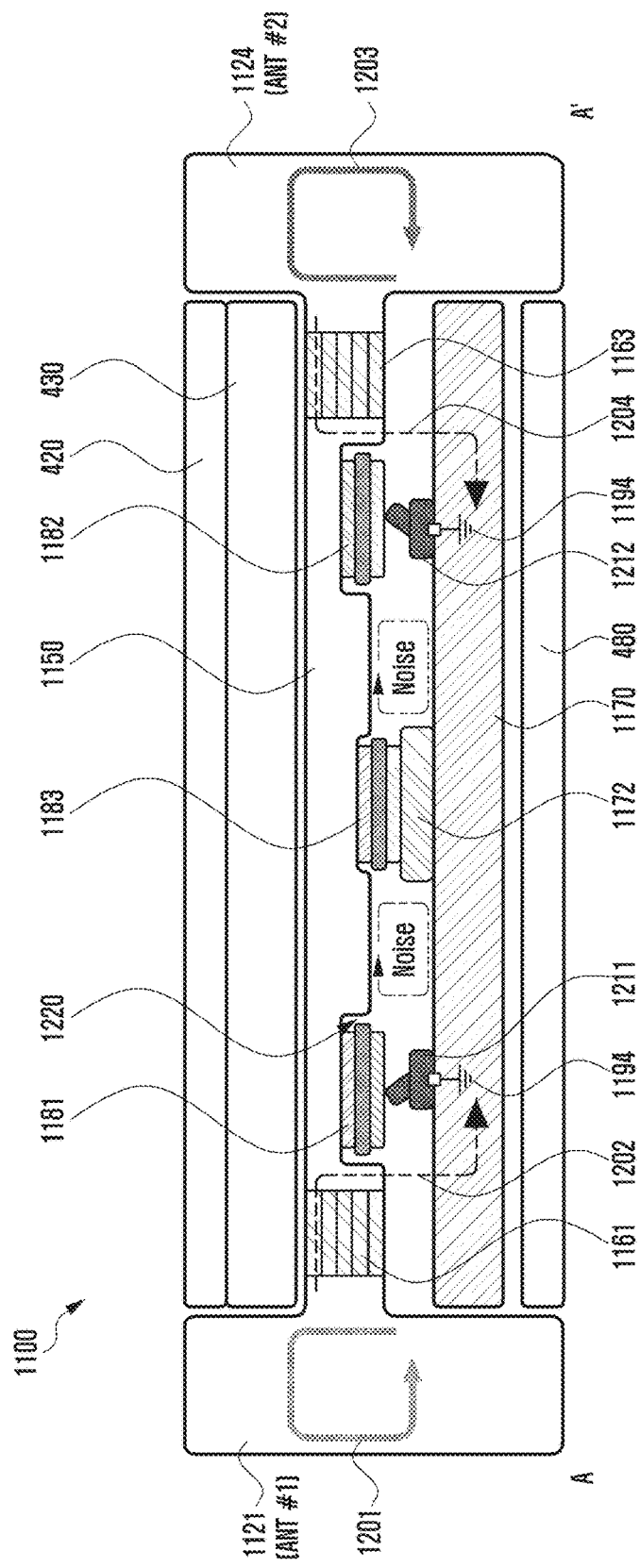
FIG. 12 is a vertical cross-sectional view illustrating an example electronic device according to an embodiment of the disclosure.

FIG. 12 is a vertical cross-sectional view illustrating an example electronic device 1100 according to an embodiment of the disclosure. For example, FIG. 12 may be a cross-sectional view of the electronic device 1100 taken along line A-A' in FIG. 11.

Referring to FIG. 12, an electronic device 1100 according to an embodiment of the disclosure includes a first plate (e.g., the front plate 420 in FIG. 4) facing a first side (e.g., the front side), a second plate (e.g., the rear plate 480 in FIG. 4) facing a second side (e.g., the rear side) opposite the first side, and a side member (e.g., the side member 1110 in FIG. 11) that surrounds the space between the first plate 420 and the second plate 480. According to an embodiment, in the space between the first plate 420 and the second plate 480, a display (e.g., the display 430 in FIG. 4), a mid-plate (e.g., the mid-plate 1150 in FIG. 11), and a PCB (e.g., the PCB 1170 in FIG. 11) may be positioned.

According to an embodiment, the display 430 may be positioned on one face (e.g., the front face) of the mid-plate 1150 and the PCB 1170 may be positioned on the other face (e.g., the rear face) of the mid-plate 1150. According to an embodiment, a first dielectric gap (e.g., the first dielectric gap 1160 in FIG. 16) filled with a first dielectric material (e.g., the first dielectric material 1161 in FIG. 11) may be positioned between the mid-plate 1150 and the first conductive portion (ANT #1) (e.g., the first conductive portion 1121 in FIG. 11) of the side member 1110, and a second dielectric gap (e.g., the second dielectric gap 1163 in FIG. 11) filled with a second dielectric material (e.g., the second dielectric material 1163 in FIG. 11) may be positioned between the mid-plate 1150 and the fourth conductive portion (ANT #2) (e.g., the fourth conductive portion 1124 in FIG. 11) of the side member 1110.

According to an embodiment, multiple capacitive structures 1181, 1182, and 1183 are positioned between the mid-plate 1150 and the PCB 1170, and the multiple capacitive structures 1181, 1182, and 1183 may be attached to the mid-plate 1150. According to an embodiment, the multiple capacitive structures 1181, 1182, and 1183 may be positioned adjacent to the boundary portions of the first dielectric material 1161 and the second dielectric material 1163 and the mid-plate 1150, or may be positioned in the middle portion of the mid-plate 1150.

According to an embodiment, the mid-plate 1150 may include multiple recesses 1220 that accommodate the multiple capacitive structures 1181, 1182, and 1183 on the surface facing the second plate 480.

According to an embodiment, the multiple capacitive structures 1181, 1182, and 1183 may be electrically connected to the grounds (e.g., the fifth grounds 1194 in FIG. 11) of the PCB 1170 via conductive members (e.g., C-clips 1211 and 1212) or may be attached directly to a shield frame (e.g., the shield frame structure 1172 in FIG. 11) coupled to the printed circuit board 1170. The first capacitive structure 1181 may be electrically connected to the fifth ground 1194 of the PCB 1170 through the first conductive member 1211, the second capacitive structure 1182 may be electrically connected to the fifth ground 1194 of the PCB board 1170 through the second conductive member 1212, and the third capacitive structure 1183 may be directly attached to the shield frame structure 1172 coupled to the PCB 1170. According to an embodiment, the third capacitive structure 1183 may be directly attached to the shield frame structure 1172 coupled to the PCB 1170, thereby being electrically connected to a ground of the PCB 1170 (e.g., the fifth grounds 1194 in FIG. 11).

According to an embodiment, when the electronic device 1100 outputs a first RF signal F0 through the first conductive portion 1121 (ANT #1), which is the first antenna (ANT #1), an electric field 1201 may be generated by the antenna (ANT #1). When the electric field 1201 is generated by the first antenna (ANT #1), a first image current 1202 corresponding to the electric field 1201 may be induced in the mid-plate 1150 disposed to face the first conductive portion 1121 (ANT #1). The induced first image current 1202 may be generated at the boundary portion of the mid-plate 1150 and the first dielectric gap 1160 through the first dielectric gap 1160, and the generated first image current 1202 may be absorbed and removed to the fifth ground 1194 of the PCB 1170 through the first capacitive structure 1181 and the first conductive member 1211.

According to an embodiment, when the electronic device 1100 outputs a second RF signal F1 through the fourth conductive portion 1124 (ANT #2), which is the second antenna (ANT #1), an electric field 1203 may be generated by the second antenna (ANT #2). When the electric field 1203 is generated by the second antenna (ANT #2), a second image current 1204 corresponding to the electric field 1203 may be induced in the mid-plate 1150 disposed to face the fourth conductive portion 1124 (ANT #2). The induced second image current 1204 may be generated at the boundary portion of the mid-plate 1150 and the second dielectric gap 1162 through the second dielectric gap 1162, and the generated second image current 1204 may be absorbed (or removed) to the fifth ground 1194 of the PCB 1170 through the second capacitive structure 1182 and the second conductive member 1212.

According to an embodiment, during the driving of the electronic device 1100, noise (e.g., electromagnetic interference (EMI)) may be generated internally, or noise may be generated from the outside. The noise may move into the middle portion of the mid-plate 1150 while moving through the mid-plate 1150, and the moved noise may be bypassed to a ground (the fifth grounds 1194 in FIG. 11) of the PCB 1170 through the third capacitive structure 1183.

In an electronic device (e.g., the electronic device 500 in FIG. 5) according to various embodiments of the disclosure, as a medium for connecting a capacitive structure (e.g., the capacitive structure 580 in FIG. 5) to a ground plane of a PCB (e.g., the PCB 570 in FIG. 5), a conductive member (e.g., the second conductive member (e.g., a C-clip) 820 in FIG. 5) may or may not be used. For example, the capacitive structure 580 may be directly attached to a component of the PCB 1170 or the like. This will be described in more detail with reference to FIG. 13.

Figure 13:
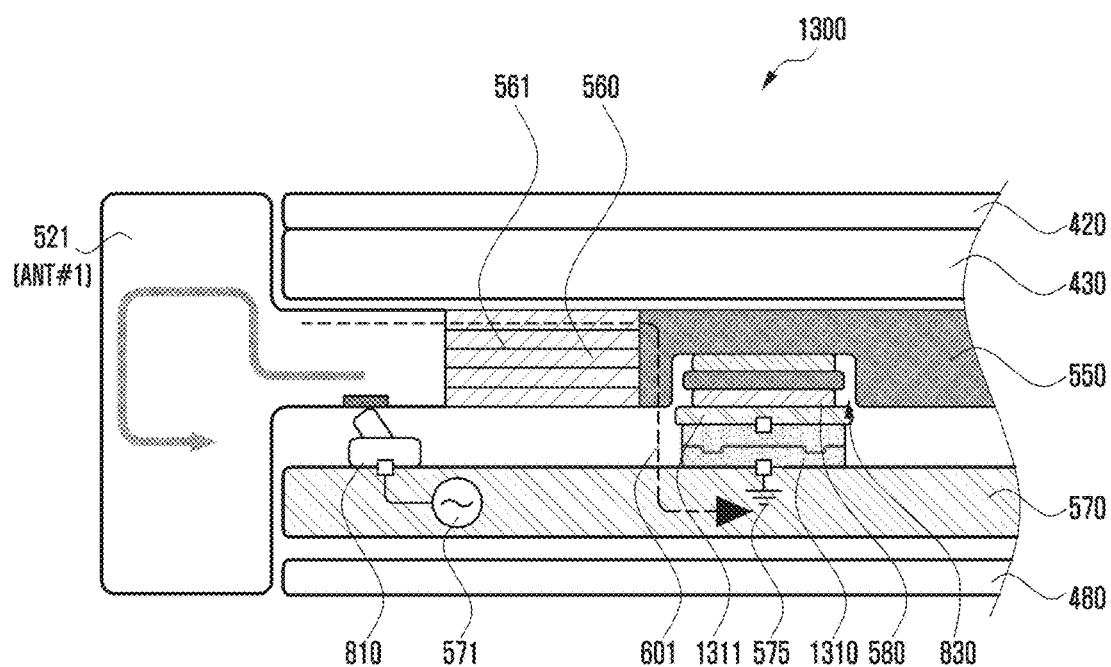
FIG. 13 is a vertical cross-sectional view illustrating a portion of an example electronic device according to another embodiment of the disclosure.

FIG. 13 is a vertical cross-sectional view illustrating a portion of an example electronic device according to another embodiment of the disclosure. Except for the components described below, the electronic device 1300 shown in FIG. 13 may be substantially the same as or similar to the electronic device 500 shown in FIG. 8. In FIG. 13, components that are substantially the same as those of the electronic device 500 shown in FIG. 8 are denoted by the same reference numerals, and descriptions of components denoted by the same reference numerals as those of FIG. 8 will not be repeated here.

Referring to FIG. 13, in the electronic device 1300 (e.g., the electronic device 101 of FIG. 1) according to another embodiment of the disclosure, a capacitive structure (e.g., the capacitive structure 580 in FIG. 8) may be coupled to a connector 1310 of a PCB (e.g., the PCB 570 in FIG. 8 to be electrically connected to a ground (e.g., the fourth ground 575 in FIG. 5). At least part of the capacitive structure 580 is positioned to face the connector 1310 of the PCB 570 and is attached to the metal plate 1311 formed on the connector 1310, thereby being connected to a ground (e.g., the fourth ground 575 in FIG. 5).

According to an embodiment, the connector 1310 may be a terminal that connects a flexible printed circuit board (FPCB) to the PCB 570. According to an embodiment, the FPCB may be a fingerprint-sensing FPCB, a force-sensing FPCB, or an antenna FPCB (e.g., the antenna 470 in FIG. 4).

Figure 14:
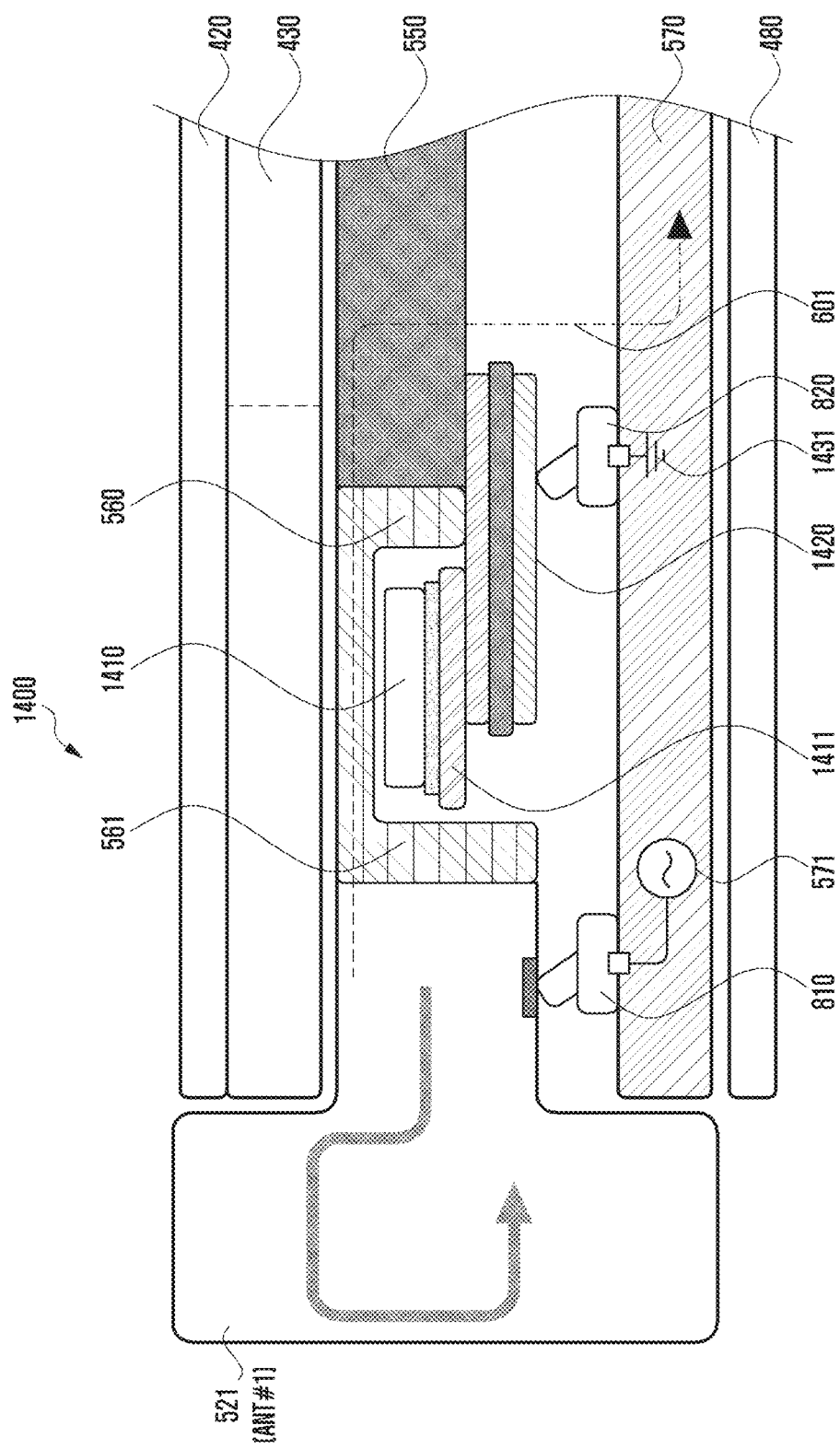
FIG. 14 is a vertical cross-sectional view illustrating a portion of an example electronic device according to still another embodiment of the disclosure.

FIG. 14 is a vertical cross-sectional view illustrating a portion of an example electronic device according to still another embodiment of the disclosure. Except for the components described below, the electronic device 1400 shown in FIG. 14 may be substantially the same as or similar to the electronic device 500 shown in FIG. 8. In FIG. 14, components that are substantially the same as those of the electronic device 500 shown in FIG. 8 are denoted by the same reference numerals, and descriptions of components denoted by the same reference numerals as those of FIG. 8 will not be repeated here.

Referring to FIG. 14, in an electronic device 1400 (e.g., the electronic device 101 of FIG. 1) according to still another embodiment of the disclosure, at least some components may be positioned in a dielectric gap (e.g., the dielectric gap 560 in FIG. 5), and at least part of a capacitive structure 1420 (e.g., the capacitive structure 580 in FIG. 8) may be attached to a component (e.g., a camera module 1410) positioned in the dielectric gap 560 so as to connect the component (e.g., the camera module 1410) and a ground (e.g., a fourth ground 575 in FIG. 5) of a PCB (e.g., the PCB 570 in FIG. 8).

According to an embodiment, the components positioned in the dielectric gap 560 may include, for example, the camera module 1410 (e.g., the camera module 205 in FIG. 2) or a sensor module (e.g., the sensor module 204 in FIG. 2). When a component having an electrically floated metal plate 1411, e.g., the camera module 1410, is positioned in the dielectric gap, it may cause deterioration of antenna performance. For example, the camera module 1410 may support a high-speed continuous shooting function or the like, and high-frequency noise may be generated while the camera module 1410 operates, which may cause deterioration of antenna performance.

In the electronic device 1400 of the disclosure, at least part of the capacitive structure 1420 may be attached to the metal plate 1411 of a component (e.g., the camera module 1410) positioned in the dielectric gap 560, thereby electrically connecting the component 1400 (e.g., the camera module 1410) and the ground 1431 (e.g., the fourth ground 575 in FIG. 5) of the PCB 570 to each other. Alternatively, in the electronic device 1400 of the disclosure, the conductive structure 1420 is capable of shifting a parasitic resonant frequency band caused due to at least one component (e.g., the camera module 1410) positioned in the dielectric gap 560 to a band different from the resonant frequency band of an antenna.

As described above, with an electronic device according to various embodiments of the disclosure, it is possible to remove and/or reduce image current that deteriorates antenna performance and to reduce the length of a wiring line for ground connection of a PCB by disposing a capacitive structure configured to block a conductive path on a mid-plate.

The electronic device according to various embodiments may be one of various types of electronic devices. The electronic devices may include, for example, and without limitation, a portable communication device (e.g., a smart-phone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, firmware, or any combinations thereof and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturers server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments thereof, it will be understood that the various example embodiments are intended to be illustrative, not limiting. One skilled in the art will understand that various changes in form and detail may be made without departing from the spirit and scope of the disclosure as may be defined, for example, in the appended claims and equivalents thereto.

What is claimed is:

1. An electronic device comprising:
   a housing including a first plate, a second plate facing a direction opposite the first plate, and a side member comprising a side wall surrounding a space between the first plate and the second plate, wherein the side member includes a conductive portion;
   a conductive mid-plate disposed inside the housing parallel to the second plate, the conductive mid-plate defining an opening together with the conductive portion when viewed from above the second plate;
   a display positioned between the conductive mid-plate and the first plate, the display being viewable through at least part of the first plate;
   a dielectric material filling at least part of the opening;
   a printed circuit board (PCB) disposed inside the housing between the conductive mid-plate and the second plate, the PCB including a ground plane; and
   a capacitive structure comprising a conductive material disposed between the conductive mid-plate and the PCB, wherein the dielectric material is disposed between the capacitive structure and the conductive portion when viewed from above the second plate, wherein the capacitive structure includes:
   a first conductive layer connected to the conductive mid-plate;
   a second conductive layer spaced apart from the first conductive layer; and
   a dielectric layer interposed between the first conductive layer and the second conductive layer; and a conductive member comprising a conductive material interposed between, and in contact with, the second conductive layer and the PCB, wherein the conductive member is electrically connected to the ground plane.

2. The electronic device of claim 1, wherein the conductive mid-plate includes a surface facing the second plate, and a recess formed in the surface, and wherein at least part of the capacitive structure is disposed in the recess.

3. The electronic device of claim 1, wherein the PCB further includes a wireless communication circuit electrically connected to the conductive portion.

4. The electronic device of claim 3, wherein the conductive portion is electrically connected to the ground plane.

5. The electronic device of claim 4, wherein a distance between the capacitive structure and the dielectric material is less than a distance between the conductive portion and the dielectric material.

6. The electronic device of claim 1, wherein the first conductive layer has a first size when viewed from above the second plate, the second conductive layer has a second size when viewed from above the second plate, the dielectric layer has a third size when viewed from above the second plate, and the third size is greater than each of the first size and the second size.

7. The electronic device of claim 6, wherein the first size and the second size are substantially the same.

8. The electronic device of claim 1, wherein the conductive portion has a shape elongated in a first direction, and the capacitive structure is arranged in a direction parallel to the first direction.

9. The electronic device of claim 1, wherein the conductive portion includes:

a first antenna positioned on one face of the side member and configured to resonate a first RF signal; and a second antenna positioned on another face of the side member facing away from the one face of the side member and configured to resonate a second RF signal having a frequency higher than a frequency of the first RF signal, wherein the capacitive structure includes:

at least one first capacitive structure comprising a conductive material positioned adjacent to the first antenna and having a first capacitance, and at least one second capacitive structure comprising a conductive material positioned adjacent to the second antenna and having a second capacitance, and wherein the second capacitance is less than the first capacitance.

10. The electronic device of claim 9, wherein the capacitive structure further includes at least one third capacitive structure comprising a conductive material positioned in a middle portion of the conductive mid-plate, and wherein the third capacitive structure is directly attached to a shield frame provided on the PCB.

11. The electronic device of claim 9, wherein at least part of the first capacitive structure and at least a part of the second capacitive structure are directly attached to a metal plate of a connector provided on the PCB.

12. The electronic device of claim 9, further comprising:

at least one component disposed inside the opening and including at least one metal plate, wherein at least part of the first capacitive structure and at least a part of the second capacitive structure are directly attached to the metal plate of the component.

13. An electronic device comprising:

a housing including: a first plate, a second plate facing a direction opposite the first plate, and a side member comprising a side wall surrounding a space between the first plate and the second plate, wherein the side member includes a conductive portion;

a conductive mid-plate disposed in the housing parallel to the second plate;

a dielectric gap formed between the conductive portion and the conductive mid-plate;

a printed circuit board (PCB) disposed inside the housing between the conductive mid-plate and the second plate, the PCB including a ground plane; and a capacitive structure comprising a conductive material positioned at a boundary portion of the dielectric gap and the conductive mid-plate between the conductive mid-plate and the PCB, the capacitive structure including:

a first conductive layer connected to the conductive mid-plate;

a second conductive layer spaced apart from the first conductive layer and electrically connected to the ground plane; and a dielectric layer interposed between the first conductive layer and the second conductive layer.

14. The electronic device of claim 13, further comprising:

a conductive member comprising a conductive material interposed between and in contact with the second conductive layer and the PCB, wherein the conductive member is electrically connected to the ground plane.

15. The electronic device of claim 13, wherein the first conductive layer has a first size when viewed from above the second plate, the second conductive layer has a second size when viewed from above the second plate, the dielectric layer has a third size when viewed from above the second plate, and the third size is greater than each of the first size and the second size.

16. The electronic device of claim 15, wherein the first size and the second size are substantially the same.

17. The electronic device of claim 13, wherein the conductive portion has a shape elongated in a first direction, and the capacitive structure is arranged in a direction parallel to the first direction.

18. The electronic device of claim 13, wherein the conductive portion includes:

a first antenna positioned on one face of the side member, wherein the first antenna is configured to resonate a first RF signal; and a second antenna positioned on another face of the side member facing away from the one face of the side member, wherein the second antenna is configured to resonate a second RF signal having a frequency higher than a frequency of the first RF signal, wherein the capacitive structure includes:

at least one first capacitive structure comprising a conductive material disposed adjacent to the first antenna and having a first capacitance; and at least one second capacitive structure comprising a conductive material disposed adjacent to the second antenna and having a second capacitance, and wherein the second capacitance is less than the first capacitance.

19. The electronic device of claim 18, wherein the capacitive structure further includes at least one third capacitive structure comprising a conductive material disposed in a middle portion of the conductive mid-plate, and
   wherein the third capacitive structure is directly attached to a shield frame provided on the PCB.
20. The electronic device of claim 18, further comprising:
   at least one component disposed inside the dielectric gap and having at least one metal plate,
   wherein at least part of the first capacitive structure and at least a part of the second capacitive structure are directly attached to the metal plate of the component.

* * * * *